(12) United States Patent
Selig et al.

(10) Patent No.: US 9,319,019 B2
(45) Date of Patent: Apr. 19, 2016

(54) METHOD FOR AUGMENTING A LISTENING EXPERIENCE

(71) Applicant: Symphonic Audio Technologies Corp., San Francisco, CA (US)

(72) Inventors: Aaron Alexander Selig, San Francisco, CA (US); Varun Srinivasan, San Francisco, CA (US)

(73) Assignee: Symphonic Audio Technologies Corp., San Francisco, CA (US)

( * ) Notice: Subject to any disclaimer, the term of this patent is extended or adjusted under 35 U.S.C. 154(b) by 141 days.

(21) Appl. No.: 14/206,499

(22) Filed: Mar. 12, 2014

(65) Prior Publication Data

US 2014/0334644 A1    Nov. 13, 2014

Related U.S. Application Data

(60) Provisional application No. 61/778,188, filed on Mar. 12, 2013, provisional application No. 61/831,798, filed on Jun. 6, 2013, provisional application No. 61/867,480, filed on Aug. 19, 2013, provisional application No. 61/880,395, filed on Sep. 20, 2013.

(51) Int. Cl.
    *H03G 3/00*    (2006.01)
    *H03G 5/16*    (2006.01)

(52) U.S. Cl.
    CPC .................... *H03G 5/165* (2013.01)

(58) Field of Classification Search
    CPC ............................. H01R 25/70; H01R 25/30
    USPC ...................... 381/56–60, 314, 320, 312, 108
    See application file for complete search history.

(56) References Cited

U.S. PATENT DOCUMENTS

| | | | |
|---|---|---|---|
| 6,813,490 B1 | 11/2004 | Lang et al. | |
| 6,853,850 B2 | 2/2005 | Shim et al. | |
| 8,379,871 B2 * | 2/2013 | Michael | H04R 5/04 381/312 |
| 2002/0100044 A1 | 7/2002 | Daniels | |
| 2003/0003864 A1 | 1/2003 | Locke | |
| 2003/0064746 A1 * | 4/2003 | Rader | H04R 25/70 455/550.1 |
| 2003/0182000 A1 * | 9/2003 | Muesch | H04R 25/70 700/94 |
| 2004/0102931 A1 | 5/2004 | Ellis et al. | |
| 2005/0260985 A1 | 11/2005 | Rader et al. | |
| 2006/0045281 A1 * | 3/2006 | Korneluk | A61B 5/121 381/60 |
| 2006/0112123 A1 | 5/2006 | Clark et al. | |
| 2007/0255435 A1 | 11/2007 | Cohen et al. | |
| 2008/0208820 A1 | 8/2008 | Usey et al. | |
| 2009/0076825 A1 | 3/2009 | Bradford et al. | |
| 2009/0154745 A1 | 6/2009 | Latzel | |
| 2009/0180631 A1 | 7/2009 | Michael et al. | |
| 2010/0119093 A1 | 5/2010 | Uzuanis et al. | |
| 2010/0145134 A1 | 6/2010 | Madsen | |
| 2010/0191143 A1 | 7/2010 | Ganter et al. | |
| 2011/0153603 A1 | 6/2011 | Adiba et al. | |

(Continued)

*Primary Examiner* — Disler Paul
(74) *Attorney, Agent, or Firm* — Jeffrey Schox; Ivan Wong

(57) ABSTRACT

One variation of a method for augmenting a listening experience of a user through an audio device includes: detecting a location of the audio device; selecting a set of audio output feedbacks, each audio output feedback in the set of audio output feedback entered by an individual and associated with a physical site proximal to the location; identifying a common feature across audio output feedbacks within the set of audio output feedbacks; transforming an audio signal into a processed audio signal according to a hearing profile of the user and the common feature; and outputting the processed audio signal through the audio device.

20 Claims, 6 Drawing Sheets

(56) References Cited

U.S. PATENT DOCUMENTS

| | | |
|---|---|---|
| 2011/0191361 A1 | 8/2011 | Gupta et al. |
| 2011/0280409 A1 | 11/2011 | Michael et al. |
| 2011/0280422 A1 | 11/2011 | Neumeyer et al. |
| 2011/0293123 A1 | 12/2011 | Neumeyer et al. |
| 2011/0294541 A1* | 12/2011 | Zheng .................. G08B 21/24 455/556.1 |
| 2011/0300806 A1 | 12/2011 | Lindahl et al. |
| 2012/0021808 A1 | 1/2012 | Tseng |
| 2012/0057078 A1 | 3/2012 | Fincham |
| 2012/0110004 A1 | 5/2012 | Meijer |
| 2012/0183163 A1 | 7/2012 | Apfel |
| 2012/0306631 A1 | 12/2012 | Hughes |
| 2012/0311581 A1 | 12/2012 | Balmin et al. |
| 2013/0052956 A1 | 2/2013 | McKell |
| 2013/0142366 A1 | 6/2013 | Michael et al. |
| 2013/0151563 A1 | 6/2013 | Addepalli et al. |
| 2013/0177189 A1 | 7/2013 | Bryant et al. |
| 2013/0266165 A1* | 10/2013 | Neumeyer ............ H04R 25/30 381/314 |
| 2014/0079241 A1* | 3/2014 | Chan .................... H04H 20/86 381/77 |
| 2014/0314261 A1 | 10/2014 | Selig et al. |
| 2014/0334644 A1 | 11/2014 | Selig et al. |
| 2014/0379343 A1 | 12/2014 | Karimi-Cherkandi et al. |
| 2015/0078575 A1 | 3/2015 | Selig et al. |

\* cited by examiner

METHOD FOR AUGMENTING A LISTENING EXPERIENCE

CROSS-REFERENCE TO RELATED APPLICATIONS

This application claims the benefit of U.S. Provisional Application No. 61/778,188, filed on 12 Mar. 2013, U.S. Provisional Application No. 61/831,798, filed on 6 Jun. 2013, U.S. Provisional Application No. 61/867,480, filed on 19 Aug. 2013, and U.S. Provisional Application No. 61/880,395, filed on 20 Sep. 2013, all of which are incorporated in their entireties by this reference.

This application is related to U.S. patent application Ser. No. 14/178,034, filed 11 Feb. 2014, U.S. Provisional Application No. 61/763,163, filed on 11 Feb. 2013, U.S. Provisional Application No. 61/831,796, filed on 6 Jun. 2013, U.S. Provisional Application No. 61/867,436, filed on 19 Aug. 2013, and U.S. Provisional Application No. 61/880,367, filed on 20 Sep. 2013, all of which are incorporated in their entireties by this reference.

This application is further related to U.S. patent application Ser. No. 14/178,068, filed 11 Feb. 2014, U.S. Provisional Application No. 61/763,182, filed on 11 Feb. 2013, U.S. Provisional Application No. 61/867,449, filed on 19 Aug. 2013, and U.S. Provisional Application No. 61/880,377, filed on 20 Sep. 2013, all of which are incorporated in their entireties by this reference.

TECHNICAL FIELD

This invention relates generally to the field of hearing augmentation, and more specifically to a new and useful method for augmenting hearing in the field of hearing augmentation.

DESCRIPTION OF THE EMBODIMENTS

The following description of the embodiments of the invention is not intended to limit the invention to these embodiments, but rather to enable any person skilled in the art to make and use this invention.

1. First Method

Figure 1:
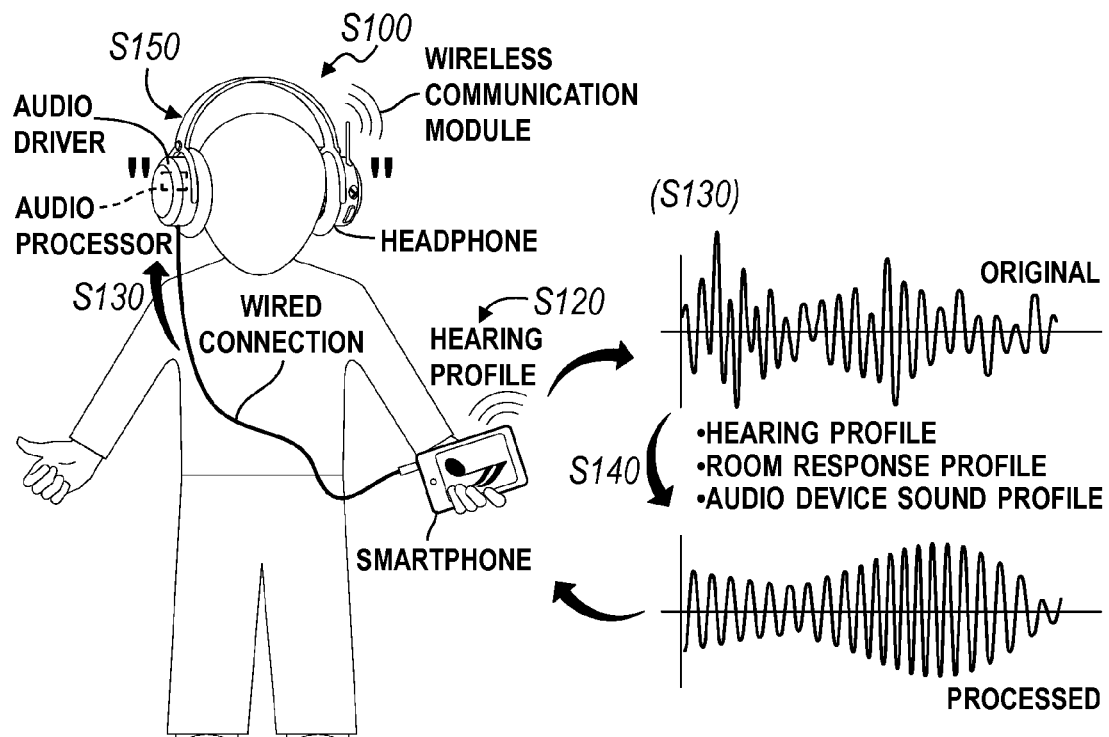
FIG. 1 is a flowchart representation of a first method in accordance with the invention.

As shown in FIG. 1, first method S100 for customizing sound output from an audio device includes: identifying a user who is using or is within hearing distance of the audio device in Block S110; receiving a hearing profile of the user in Block S120; receiving an audio signal in Block S130; processing the audio signal according to a hearing profile of the user in Block S140; outputting the processed audio signal through an audio driver arranged in the audio device in Block S150.

Generally, first method S100 functions to implement a hearing profile of a user, a sound profile of the audio device, and/or a response profile of a space occupied by the user to customize a sound output of the audio device. First method S100 can process prerecorded or live sound and output the processed sound through the audio device to augment the prerecorded or live sound for the user. Additionally or alternatively, first method S100 can process live sound and output the processed sound through the audio device as a replacement for live sound for the user. First method S100 can further identify multiple users or devices, gather hearing profiles for each of the multiple users or unique device profiles, process the sound data to accommodate unique profiles of the multiple users or devices, and output sound through one or more audio drivers in the audio device or system accordingly, such as by outputting processed sounds through various audio drivers in the audio device according to where the multiple users are arranged relative to the audio drivers in the audio device.

First method S100 can be configured to output processed sound through an audio device that is a set of in-ear headphones (i.e., earbuds), a set of over-ear headphones, an in-car stereo system, a home stereo or theatre system (shown in FIG. 3), or a public address ("PA") system. First method S100 can also be configured to output processed sound through an audio device arranged in a professional sound room, a movie theatre, an opera house, a symphony hall, a classroom, a lecture hall, or any other relevant space or building.

Blocks of first method S100 can be implemented directly on the audio device, such as by a processor integrated into the audio device that is a set of headphones or a hearing aid. Alternatively, Blocks of first method S100 can be implemented by an amplifier (shown in FIG. 4), control board, or sound board coupled to the one or more audio drivers (i.e., speakers) in the audio device. For example, a custom integrated circuit, such as a microprocessor integrating specialized audio processing control logic, can be specifically configured to implement one or more Blocks of first method S100 and can thus be integrated into various audio devices to enable various functionalities described herein. Additionally or alternatively, one or more Blocks of first method S100 can be implemented on a remote server, a mobile computing device (e.g., smartphone, tablet, laptop computer), or other computer system or computer network in communication with the audio device. For example, the computer system or computer network can communicate sound, user, device, and/or space data with the audio device over a wired connection (e.g., via an auxiliary, ⅛" audio, USB, or proprietary jack or connector) or a wireless connection (e.g., via Bluetooth, Wi-Fi, Zigbee, RFID wireless communication protocol). However, Blocks of first method S100 can be implemented on any other one or more devices and data can be communicated between any two or more devices in any other way to enable customization of sound output from one or more audio drivers in one or more audio devices.

First method S100 can be implemented across multiple audio devices to normalize sound output across multiple audio devices for one user, that is, to normalize how the user perceives the same sound across several different audio devices. For example, Block S140 can process the audio signal based on a sound response of a space or room occupied by the user and/or based on a sound output response of the audio device (or one or more audio drivers of the audio device) in order to minimize or remove sound output variances across various audio devices, rooms, or spaces. Additionally or alternatively, first method S100 can be implemented across multiple audio devices to normalize perception of sound across multiple users, that is, to normalize how various users hear the same sound by minimizing or removing sound perception variances that arise from different audio devices used by various users and/or various positions of users in one space or room. However, first method S100 can be implemented in any other way to process audio for one or more users according to any other schema.

Block S120 of first method S100 recites receiving a hearing profile of the user. Generally, Block S120 functions to collect relevant user hearing data in order to enable subsequent Blocks of first method S100 to tailor the audio signal to the user's hearing needs. As described in U.S. Provisional Application No. 61/763,163, which is incorporated herein by reference, the user can perform one or more hearing tests on a native hearing test application executing on a mobile computing device (e.g., smartphone, tablet, laptop), Results of the hearing test (i.e., the user's hearing profile) can be generated by the mobile computing device and/or by a remote server in communication with the mobile computing device, and the mobile computing device can store the user's hearing profile and/or retrieve the user's hearing test from the remote server when necessary, such as when a new audio device communicates with the mobile computing device or when an audio device, implementing Block S120, requests the user's hearing profile.

Figure 2:
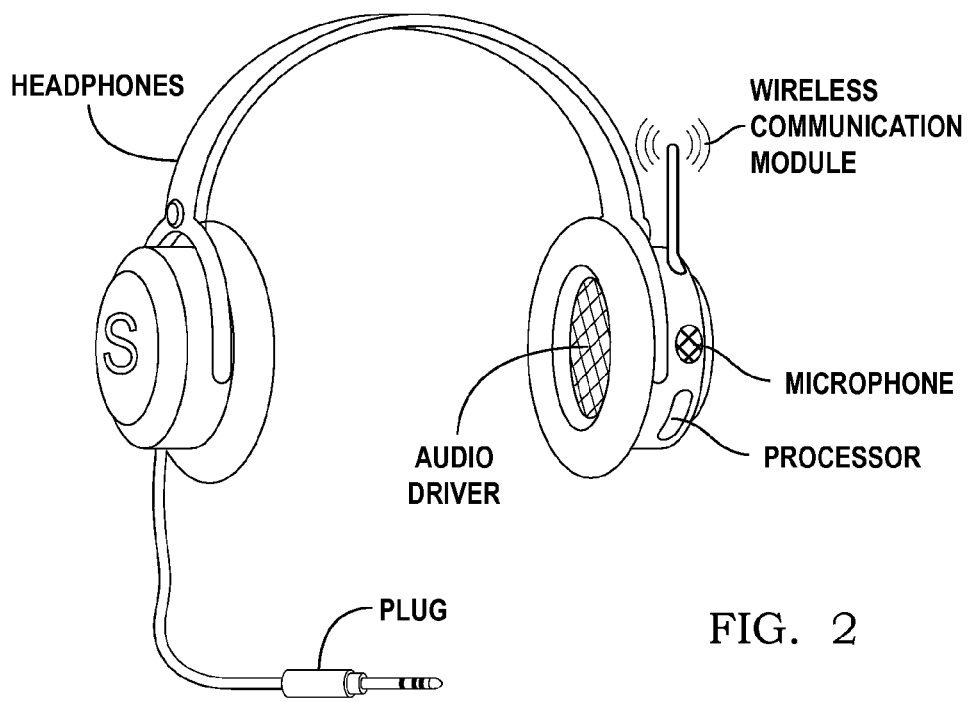
FIG. 2 is a schematic representation of a set of headphones in accordance with one variation of the first method.

In one example implementation in which the audio device is a set of headphones including a processor executing at least one Block of first method S100, as shown in FIG. 2, the processor communicates with the user's mobile computing device to retrieve the user hearing profile. For example, the processor can communicate with the mobile computing device via a wireless communication module integrated into the set of headphones, such as via Wi-Fi, cellular, or Bluetooth communication protocol. Alternatively, the processor can communicate with the mobile computing device via a wired connection, such as via an auxiliary (e.g., ⅛" audio) jack, a USB port, or proprietary physical jack or port on the mobile computing device. In this example implementation, the audio device can request a current user hearing profile each time the audio device is connected to the mobile computing device (via a wireless or wired connection), or the mobile computing device can push a current user hearing profile when a user hearing profile stored on the audio device is no longer current. However, in this example implementation, the set of headphones can implement Block S120 in any other way to retrieve a hearing profile from the user's mobile computing device.

In another example implementation in which the audio device is a stereo system in a motor vehicle, the stereo system can implement Block S120 by wirelessly sync'ing with a mobile computing device carried by the user once or each time the user enters the vehicle, thereby retrieving a current user hearing profile from the user's mobile computing device. For example, the stereo system (and/or motor vehicle) can sync with the user's mobile computing device via a Bluetooth connection.

In another example implementation in which the audio device is a sound (e.g., PA) system in a theatre, concert hall, symphony hall, lecture hall, classroom, or other room or space configured for occupation by multiple users, the sound system can implement Block S120 by wirelessly polling mobile computing devices within range and retrieving available profiles from the mobile computing devices, including the user's hearing profile, device profile, and other relevant data. For example, the sound system can retrieve available hearing profiles from mobile computing devices wireless communicating with a Wi-Fi hub or wireless router connected to the sound system. However, the audio device can implement Block S120 in any other way to implement Block S120.

One variation of first method S100 includes Block S110, which recites identifying a user within hearing distance of the audio device. Generally, Block S110 functions to identify a user with current and/or anticipated future sound augmentation needs such that the user's hearing profile can be retrieved. In the foregoing example in which the audio device is a sound (e.g., PA) system arranged in a room or space configured for occupation by multiple users, user hearing profiles can be stored on a remote database accessible over the Internet. In this example, the sound system can implement Block S110 by polling mobile computing devices within range of the sound system for user identification information, such as a name, a phone number, an email address, a social security number, a social networking profile, a username and password, etc. The sound system can further implement Block S120 by accessing the remote database and retrieving one or more user hearing profiles based on user identification information gathered in Block S110.

Similarly, in the foregoing example implementation in which the audio device is a motor vehicle sound system, the sound system can implement Block S110 by retrieving a name, a phone number, etc. (identifying the user) from a mobile computing device sync'd to the motor vehicle, and the sound system can subsequently implement Block S120 by retrieving a previously-stored hearing profile of the user from an integrated data storage module, by wirelessly retrieving a hearing profile from the user's mobile device, or by retrieving the hearing profile from a remote database over cellular communication protocol. However, the audio device can implement Block S120 in any other way to collect a hearing profile. In this example implementation, the sound system can also retrieve identification information from one or more other mobile computing devices carried by other occupants of the vehicle and retrieve one or more additional hearing profiles accordingly. The sound system can further interface with a seat occupancy sensor, a GPS sensor in an occupant's mobile computing device, a wireless (e.g., Bluetooth) transceiver in the vehicle, or any other sensor or communication device to determine which vehicle occupant is currently occupying which particular seat.

In another example implementation in which the audio device is a sound (e.g., PA) system arranged in a classroom, the sound system can implement Block S110 by determining where in the classroom one or more students are seated. In one example in which the classroom is an elementary school classroom, the sound system can implement Block S110 by accessing a database specifying the location of desks or seats arranged in the classroom and assigned to particular students. In this example, the classroom can implement Block S120 by also retrieving hearing profiles for the students present in the classroom or for students assigned to particular seats in the classroom, such as from a database that contains hearing profile information for the school's students. The hearing profiles of the students can be generated, for example, through hearing tests performed by a school nurse. In another example in which the classroom is a college lecture hall with open seating, the sound system can implement Block S110 by interfacing with or accessing data from seat occupancy sensors, Wi-Fi hubs or wireless routers, student seat check-ins, GPS sensors arranged in student mobile computing devices, or any other sensor or communication device to identify and/ or estimate a location of one or more students within the lecture hall. The sound system can further implement Block S120 by retrieving hearing profiles of the students directly from their mobile computing devices and/or from a database of hearing profiles stored on a remote server. However, the audio device can implement Block S110 and/or Block S120 in any other way to identify one or more users and access one or more hearing profiles, respectively.

Block S130 of first method S100 recites receiving an audio signal. In one implementation, Block S130 receives a prerecorded (or transmitted) audio signal, such as a digital music file, a sound component of a digital cinematic file, or an analog amplifier output of a digital or analog music, cinematic, or other file containing sound. In this implementation, Block S130 can receive the audio signal via a wired or wireless connection with a second electronic device, such as described above. In one example, the user can play a digital sound file (e.g., MP3 file) on a smartphone, and the smartphone can broadcast an analog signal corresponding to the digital sound file through a headphone jack in the smartphone. The headphones can then implement Block S140 by processing the analog signal with a processor integrated into the headphones, and the headphones can subsequently implement Block S150 by playing the processor signal through one or more speakers integrated into the headphones, as shown in FIGS. 1 and 2. In another example in which the audio device is a vehicle sound system, the user can tune the vehicle's radio to a talk radio station that broadcasts spoken audio over the AM band. The vehicle's sound system can thus implement Block S130 by wirelessly receiving a spoken audio signal from a radio tower.

In another implementation, Block S130 receives sound data in real time, such as sound captured through a microphone integrated into or in communication with the audio device. In one example, the audio device can be a hearing aid that implements Block S130 by receiving audio signals through a microphone incorporated into the hearing aid worn by the user. In this example, a processor integrated into the hearing aid can subsequently implement Block S140 by processing the audio signal, and a speaker in hearing aid can implement Block S150 by outputting the processed audio signal. In another example, the audio device is a sound system arranged in a classroom, and the sound system implements Block S130 by receiving sound data from multiple microphones arranged throughout the classroom. In yet another example, the audio device is a set of headphones plugged into a headphone jack of a smartphone carried by the user, and the headphones implement Block S130 by receiving audio data through a microphone integrated into the smartphone substantially in real time. Additionally or alternatively, in this example, the set of headphones can implement Block S130 by receiving audio data from a microphone integrated into the headphones.

In the foregoing implementations, prior to implementing Block S130 to receive audio data from an external device (e.g., a smartphone, a tablet, an external microphone), the audio device can detect or identify the external device or the external device can detect or identify the audio device. For example, the audio device and external device can sync or perform an electronic handshake automatically when within wireless range, when connected with a wireless connection, when a new or modified user hearing profile or sound profile is available, when a user is first identified in the space, or in response to any other relevant event. However, the audio device can be any other suitable device that implements Block S130 in any other suitable way to receive prerecorded, transmitted, ambient, local, or other sound signals.

Block S140 of first method S100 recites processing the audio signal according to a hearing profile of the user. Generally, Block S140 functions to adjust the audio signal based on the user's hearing profile and/or a sound profile of the audio device, a sound profile of a room or space occupied by the user, a current setting or event attended by the user (e.g., a meeting, a lecture, a phone conversation, an opera), etc. In particular, Block S140 can implement methods and techniques described in U.S. Provisional Application No. 61/763, 182 to augment or replace the sound signal for the user. Furthermore, as described in U.S. Provisional Application No. 61/763,182, Block S130 can interface with audio-device integrated or connected location (e.g., GPS) sensors, microphones, proximity sensors, or other sensors to adjust a sound profile implemented by the audio device to adjust the audio signal in real time. Block S130 can additionally or alternatively access social networking check-ins or communications, sound profiles previously implemented by the user in the same or similar space, sound profiles previously or currently implemented by other users proximal the user, or any other relevant data to update, modify or change a sound profile implemented in Block S130 to process the audio signal.

Block S140 can also adjust fillers, equalizer settings, or other audio processing profiles based on a determined origin of a sound, a type of sound, a level of sound, or any other qualitative or quantitative characteristic of the audio signal. Block S140 can additionally or alternatively adjust an audio processing profile based on a behavior or characteristic of the user, the audio device, or multiple users using or proximal one or more audio devices within a specified location. For example, Block S130 can receive audio signals from microphones arranged throughout the space, and Block S140 can evaluate the audio signals to adjust the audio output of one or more audio device in the space, such as a set of concert speakers, in order to improve the listening experience for one or more users in an audience. In another example, Block S130 can receive audio signals from one or more microphones arranged within a passenger vehicle, and Block S140 can independently alter or adjust outputs from speakers within the vehicle near specific occupants (e.g., a driver and three passengers) based on the hearing abilities (e.g., as defined in corresponding hearing profiles) to augment and improve the conversation experiences of all occupants within the vehicle. As described in U.S. patent application Ser. No. 14/178,034, Block S140 can further dynamically adjust how the audio signal is processed, such as based on varying sound levels, varying sound origins, or a varying distance between the user and a sound origin. As in the foregoing example, Block S140 can monitor a level and contour of road noise at and around the vehicle and independently adjust output levels from each speaker within the vehicle based on local road noise levels near each occupant and hearing sensitivities and deficiencies of each occupant.

In use scenarios in which the audio device identifies multiple users in Block S110 and/or receives multiple hearing profiles from multiple users in Block S120, Block S140 can combine multiple hearing profiles to customize the output of the audio driver in Block S150 for multiple users. Additionally or alternatively, in this use scenario, Block S140 can selectively apply hearing profiles, sound profiles, etc. to a subset of audio drivers in or connected to the audio device, such as based on proximity of each user to certain audio drivers, in order to simultaneously customize sound output for multiple users in the same room or space based on different hearing needs of the users. However, Block S140 can function in any other way to process the audio signal.

Block S150 of first method S100 recites outputting the processed audio signal through an audio driver arranged in the audio device. Generally, Block S150 functions to output the processed sound through one or more speakers integrated into, wirelessly connected to, or connected via a wired connection to the audio device. Block S150 can output the processed audio signal that includes a single audio channel through a single or multiple speakers, or Block S150 can output multiple audio channels of the processed audio signal through specific speakers, such as based on the location and/or orientation of the user to the speakers and/or the origin of the audio signal (e.g., in a live sound event). For example, the audio device can be a motor vehicle stereo system, and Block S140 can separately process left and right channels broadcast from a radio tower, and Block S150 can output processed left and right audio signals through respective speakers in the vehicle. However, Block S150 can function in any other way to output one or more processed audio signals through one or more audio drivers.

In one example implementation, the audio device is a motor vehicle stereo system. As described above, the stereo system can implement Block S110 by sync'ing with one or more mobile computing devices of one or more occupants of the vehicle and interfacing with various vehicle and/or mobile computing device sensors to determine where each occupant is seated, can implement Block S120 by retrieving one or more sound profiles from the mobile computing devices and/or from a remote server, and can implement Block S130 by receiving an audio signal broadcast from a radio tower, receiving an audio signal broadcast from a mobile computing device within the vehicle (e.g., over a Bluetooth connection), receiving an audio signal from a wired connection with a mobile computing device within the vehicle, receiving an audio signal from a CD in a CD player or a sound component from a DVD in a DVD player, receiving any other pre-recorded or broadcast audio signal in any other form. Alternatively, the stereo system can implement Block S130 by receiving audio signal captured by microphones arranged within the vehicle, such as audio signals capturing a conversation between vehicle occupants or a portion of a phone call routed through the stereo system, between a vehicle occupant and another individual outside the vehicle. Given the location of each occupant in the vehicle and the type of audio signal (e.g., a received radio signal or a conversation between occupants), the stereo system can implement Blocks S140 and S150 by outputting processed sound, through various speakers connected to the stereo system, tailored for each occupant of the vehicle. For example, the stereo system can boost high-frequency sounds output from a first set of speakers adjacent the driver of the vehicle who has difficulty hearing high-frequency sounds, as indicated in the first user's hearing profile, and the stereo system can boost low-frequency sounds output from a second set of speakers adjacent a passenger of the vehicle who has difficulty hearing low-frequency sounds, as indicated in the second user's hearing profile. In this example, the stereo system can also attenuate low-frequency sounds output from the first set of speakers and attenuate high-frequency sounds output from the second set of speakers based on estimate sound bleed from the second set of speakers to the first user and from the first set of speakers to the second user. In another example, audio output from a phone call for a first passenger can be selectively routed to speakers adjacent the first passenger while other speakers in the vehicle do not output call-specific audio such that other passengers in the vehicle are substantially minimally disturbed by the phone call. When implementing Block S140, the stereo system can also apply a vehicle cabin sound response profile and/or stereo system sound profile programmed into the stereo system by the vehicle's manufacturer.

Figure 3:
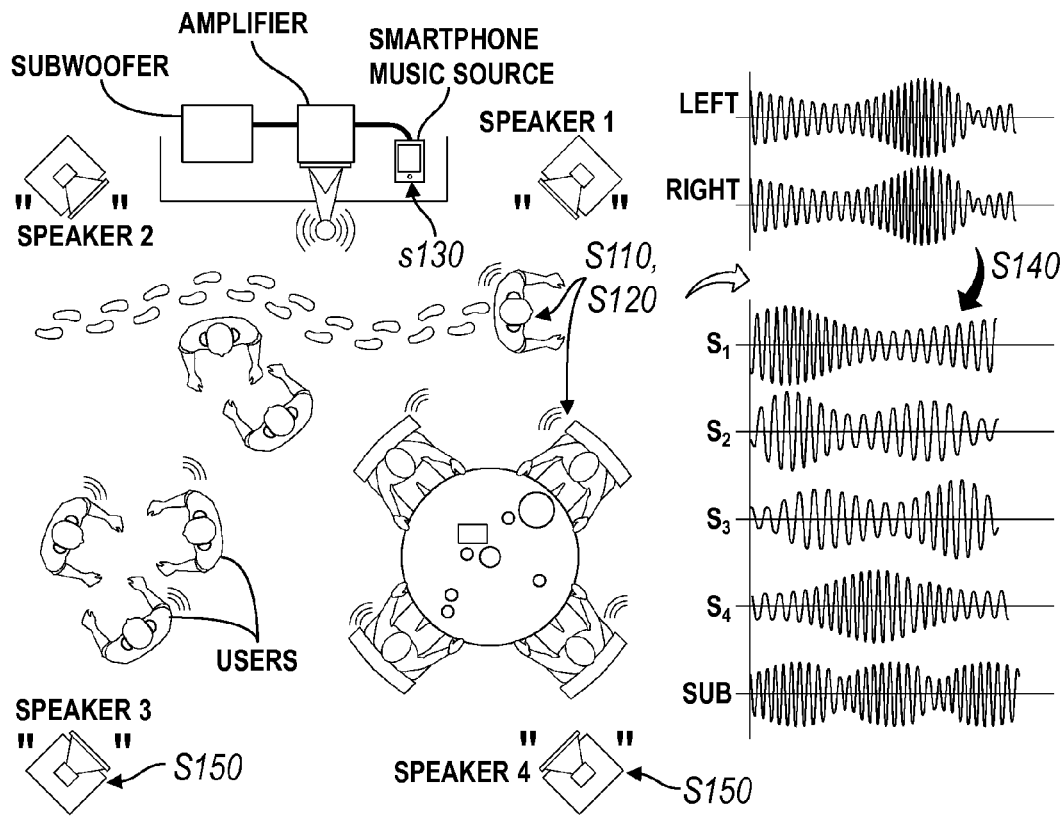
FIG. 3 is a flowchart representation of one variation of the first method.
Figure 4:
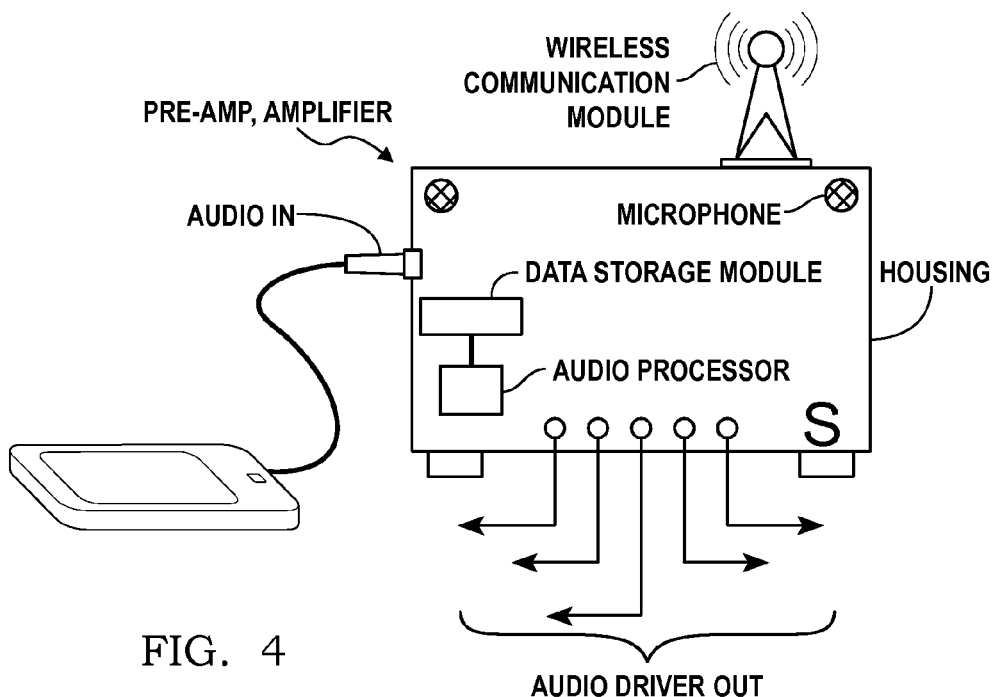
FIG. 4 is a schematic representation of a set of headphones in accordance with one variation of the first method.

In another example implementation, the audio device is a home stereo system coupled to a radio, CD player, DVD player, computing, streaming music device, cable or satellite box, television, or other media or multimedia device, as shown in FIGS. 3 and 4. As described above and similar to the foregoing example implementation, the home stereo system can implement Block S110 by sync'ing with one or more mobile computing devices of one or more users within range of the home stereo system, receiving user logins to the stereo system or local wireless router, or accessing user check-ins on a social networking system. The home stereo system can also interface with various home and/or mobile computing device sensors to determine where each user is relative to one or more speakers of the home stereo system and to identify changes in the users' positions relative to the one or more speakers. The home stereo system can implement Block S140 by processing various channels (i.e., individual speaker outputs) according to a dynamic composite audio processing profile that accounts for unique hearing profiles of multiple users moving though various positions in the room such that each user is presented with a substantially uniform and/or tailored sound regardless of where he is relative to one or more speakers in the room and/or regardless of other users in the room. The home theatre system can also process the audio signal according to a predetermined sound response profile of the room occupied by the home theatre system, such as specified in a default setting selected by a user or sound response test performed in the room by an amateur user or a professional sound technician. The home stereo system can also interface with one or more microphones to record ambient and/or local sounds and thus implement noise-cancelling techniques to reduce or eliminate such noise. Furthermore, the home stereo system can include speakers on motorized mounts, and the home stereo system can further manipulate the orientation of one or more speakers in response to a user moving through the room or a change in orientation of a user relative a speaker such that user hearing experience is substantially unaffected by motion or changing room conditions.

In other example implementations, similar techniques can be implemented in movie theaters, concert halls, lecture halls, classrooms, common spaces, restaurants, etc. in which one or more users may move throughout a space during an audio-playback or live-audio event.

In another example implementation, the audio device is a hearing aid with two in- or over-ear audio drivers. In this example implementation, the hearing aid can communicate with a smartphone or other mobile computing device carried by a user to upload a user hearing profile and/or communicate user data, microphone samples, headphone usage, battery level, errors, etc. back to mobile computing device. The hearing aid can implement Block S130 by receiving live audio signal from a microphone implemented in the mobile computing device or by receiving prerecorded audio stored on or played through the mobile computing device, such as over a wired or wireless connection. The hearing aid can alternatively receive audio signals from an external audio system, such as digital audio signals wirelessly broadcast from a PA system in a theatre, concert hall, lecture hall, or classroom. Yet alternatively, the hearing aid can receive audio signals from one or more built-in microphones. For example, the hearing aid can receive a stereo audio signal from two (or more) microphones integrated into the hearing aid, predict relevance of a sound in the audio signal to the user, boost and/or attenuate a portion of the signal corresponding to the sound based on its predicted relevance, and further process the audio signal according to the user's hearing profile, a sound profile of the hearing aid, and/or a sound response profile of a space occupied by the user before outputting the processing audio signal, in stereo, through two or more speakers in the hearing aid.

In yet another example implementation, the audio device is a set of in-ear headphones, over-ear headphones, or a Bluetooth headset that implements the same or similar functionality as the hearing aid to modify or augment music or other audio played through the headphones and/or to modify or augment ambient sounds proximal the user substantially in real time. However, the audio device can be any other suitable audio device that implements one or more Blocks of first method S100 in any other suitable way.

In still another example implementation, the audio device includes a speaker supported on a motorized stand, and Block S140 tracks motion of one or more users within a space occupied by the speaker to set a target position of the speaker, and Block S150 can implement closed-loop feedback control to reposition the speaker based on the target position set in Block S140. For example, Block S150 can control an actuator to tilt the speaker in the vertical plane as one or more users approach or move away from the speaker. In another example Block S150 can rotate the speaker about a vertical axis as one or more users walk around or passed the speaker such that the user(s) listening experience remains substantially constant within the space even as the user(s) moves relative to the speaker. However, Blocks S140 and S150 can cooperate in any other way to physically manipulate one or more speakers within a space occupied by one or more users based on hearing needs, hearing preferences, and/or motion of the users.

In one example application, first method S100 is applied to recorded audio (e.g., music) to enable audio consumers to hear audio "as an artist or producer intended." In one example, once an artist records a song including multiple audio tracks (e.g., a guitar track, a bass track, multiple drum tracks, and/or a vocal track, etc.), a producer (and/or the artist) can 'mix down' the tracks into a song. In this example, Block S120 can retrieve a hearing profile for the producer (and/or the artist), a device profile for the audio output of a physical and/or electronic mixing board used by the producer to 'mix' (i.e., produce) the song, a device profile for the audio output of monitors (e.g., speakers) and/or headphones used by the producer during song production, and/or an environmental profile of a mixing room or studio (e.g., by outputting a series of frequencies and mapping an acoustic sound response profile of a recording or production room according to recorded sound reflections). In one implementation of this example, when the song is finalized, the producer's (and/or artist's) hearing profile, the device profile for the mixing board, the device profile for the headphones, the device profile for the monitors, and/or the environmental profile, etc. can be stored with the song as meta data, such as digital data preceding the song and/or incorporated in a digital file (e.g., MP3) of the song. Subsequently, when a user downloads the digital song file onto an audio output device (e.g., an MP3 player, a smartphone, a tablet, a computer, a stereo, speakers, earbuds, and/ or headphones, etc.) and selects the song for consumption (i.e., selects the song for playback), the audio output device can implement first method S100 to extract the meta data corresponding to the song from the song file and to combine the meta data with the user's hearing profile, a device profile of the user's audio output device, and/or a current environmental profile proximal the user to adjust a volume and/or equalization (EQ) settings of the audio output device for the song. Alternatively, when the song is broadcast to a radio within a vehicle occupied by the user, the radio can receive the meta data before or at the beginning of song playback, and a stereo system within the vehicle can implement first method S100 to apply the meta data in conjunction with the user's hearing profile, a sound output profile of the stereo system (i.e., including speakers) within the vehicle, acoustics of the vehicle, etc. to set volume and/or EQ settings specifically for the song heard specifically by the user in the vehicle.

As in the foregoing example application, the audio output device can thus implement first method S100 to output customized sound for the user, wherein the output sound accommodates (i.e., normalizes for) device profiles for various devices, sound perceptions for various humans, and/or environmental profiles for spaces involved in or relevant to creation and consumption of a particular song or a particular sound. First method S100 can therefore enable a user's audio output device to output sound that substantially fulfills the intentions of the producer (and/or artist) by accommodating device profiles of audio devices, hearing profiles of humans, and/or environmental profiles of spaces related to sound creation, recording, production, and/or consumption.

First method S100 can be further implemented across multiple audio devices such that a user may experience substantially the same sound across multiple audio devices. For example, any two or more audio devices, such as a car stereo system, a home stereo system, a headset, earbuds, headphones, an intercom, a cellular phone or smartphone, etc., can be associated with a user and wirelessly connected. When in use by the user, one audio device can communicate a user hearing profile, an audio device profile, an environmental profile, and/or song (or other recorded or live audio) meta data, etc. to one or more other audio devices. First method S100 can thus be implemented across multiple audio devices to synchronize the audio devices and, as the user transitions from one audio device to another audio device, to modify the outputs of the audio devices to accommodate the user's transition from one 'primary' audio device to another audio device. For example, if a user is listening to a song through a car stereo system, then parks the car, and inserts a pair of earbuds into his ears, first method S100 can handle sound, profile, and/or meta data communication between the car stereo system and the earbuds such that an audible transition between car audio and earbud audio appears substantially seamless to the user, thereby enabling the user to continue to listen to the same song of substantially the same quality, amplitude, etc. across multiple audio devices. In this example, first method S100 can apply audio profiles of the car stereo system and the earbuds as well as environmental profiles inside and outside and proximal the car to substantially match sound quality and/or amplitude outputs from the car stereo system to the earbuds, to phase-in an audio output of the earbuds, and/or to phase out an audio output of the car stereo system. Furthermore, in this example, as the user enters his home, first method S100 can transition an audio output from the user's earbuds to the user's home stereo system by implementing an audio profile of the home stereo system, a home environmental profile, etc. output audio.

As in the foregoing example, first method S100 can be implemented on a smartphone or other mobile computing device to handle music playback and/or data streaming to other audio devices. For example, first method S100, implemented on a smartphone, can receive audio profile data from a nearby audio device (e.g., over Bluetooth or Wi-Fi communication protocol), collect user and environmental data through sensors within the smartphone (e.g., a GPS sensor to retrieve location data, a gyroscope and/or accelerometer to receive user motion data, a microphone and speaker to receive environmental sound profile data), and retrieve a user hearing profile from a remote server (e.g., via over an Internet connection). First method S100 can subsequently generate a transform matrix for a current audio output based on the audio profile data, user data, environmental data, and user profile (and/or a hearing profile of an audio producer, a device profile for a mixing board used by the producer, a device profile for monitors and/or headphones used by the producer, an environmental profile of the mixing room or studio, etc.). In one implementation, first method S100 can transmit the transform matrix from the smartphone to the corresponding audio device before and/or during playback of a corresponding song. Alternatively, first method S100 can apply the transform matrix to the corresponding song at the smartphone and then transmit the transformed song in whole or streaming from the smartphone to the corresponding audio device. First method S100 can also modify the transform matrix, apply the transform matrix to the corresponding song, and/or update streaming data to the audio device accordingly substantially in real time. Additionally or alternatively first method S100 can be implemented remotely, such as on a computer network or remote server in communication with one or more audio devices, such as through the user's smartphone, tablet, home computer, etc.

First method S100 can also automatically transition audio outputs between audio devices by monitoring user activity. For example, first method S100 can interface with an accelerometer within a set of headphones to determine that the user is removing the headphones, and first method S100 can thus transfer audio output to a home stereo system (or other local audio device) to provide a relatively seamless and automatic transition from audio output from the headphones to audio output from the home stereo system. In another example, first method S100 can interface with a GPS sensor, accelerometer, and/or gyroscope integrated into a mobile computing device (e.g., a smartphone) to identify the location of the user within a particular space and/or to track the user's movement through multiple spaces, and first method S100 can thus control audio outputs of various audio devices across adjoining spaces and/or within the particular space to output substantially uninterrupted audio at a relatively constant magnitude and/or quality (e.g., EQ, compression, etc.) to the user despite changes in the user's location and/or orientation.

First method S100 can also transfer (e.g., synchronize) current music settings between audio devices as the user transitions between them. For example, first method S100 can synchronize a microphone mute setting, a speaker mute setting, a playback volume, and/or a user-selected EQ setting, etc. from a current or 'primary' audio device (e.g., a car stereo system) to a second audio device (e.g., earbuds and/or a smartphone) as the user transitions from the current audio device to the second audio device. However, first method S100 can function in any other way or implement any other method or technique to substantially seamlessly transition between audio outputs from various devices and/or to playback sound as an artist and/or producer intended. First method S100 can also apply similar techniques to any other types of audio, such as a phone conversation, a film or movie, a television show, a prerecorded audio (and visual) lecture, a radio broadcast, etc.

2. Second Method

Figure 5:
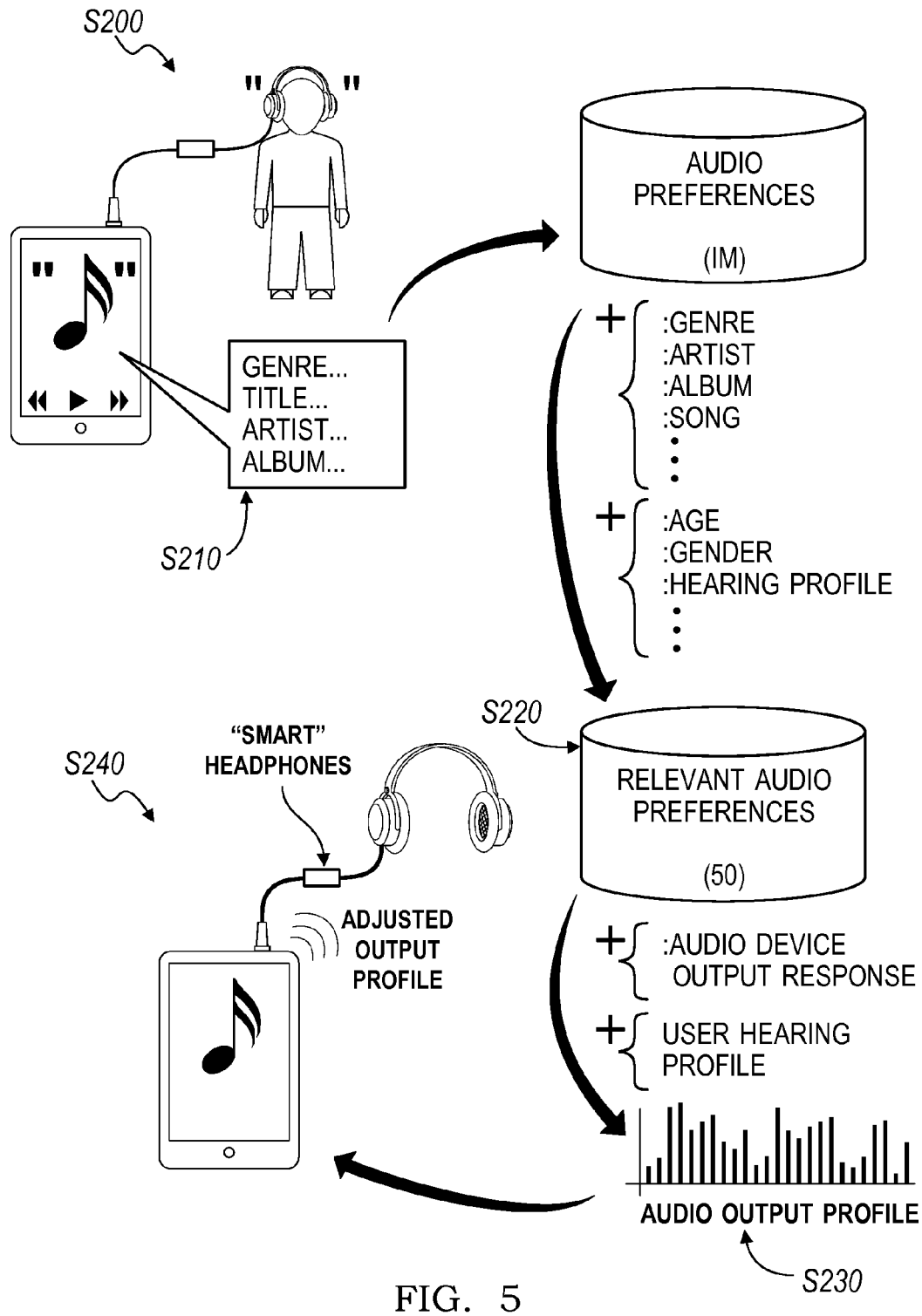
FIG. 5 is a flowchart representation of a second method in accordance with the invention.

As shown in FIG. 5, a second method S200 includes: identifying a song in playback through an audio output device of a user in Block S210; retrieving an audio preference for the song from a database including stored song preferences for multiple users in Block S220; adjusting an audio output profile for the audio output device in accordance with the audio preference for the song in Block S230; and submitting the adjusted audio output profile to the audio device in Block S240.

Generally, second method S200 functions to retrieve audio preferences of other users and to apply them to a song (or lecture, speech, music file, audio component of a video file, or other audio signal) currently in playback on a user's audio device (e.g., a tablet, headphones connected to a smartphone, a home stereo system, a vehicle stereo system, etc.). The second method S200 can enable automatic audio quality sharing amongst various users, wherein audio playback preferences (i.e., audio qualities) are added to and stored on a database as users make (and save) adjustments to equalizer (EQ) and other audio playback settings over time, and wherein audio playback data within the database is filtered and applied to a current audio output automatically for a user. The second method S200 can therefore support an audio-sharing social network in which users can set or adjust audio playback preferences for particular songs, artists, genres, recording types (e.g., specific amphitheaters), user locations, ambient noise levels, etc., and the second method S200 can thus store these audio playback preferences and apply them across users to augment or modify subsequent audio playback, such as based on the user's hearing profile, a user demographic, a user location, an ambient noise level, a particular song recording, a particular artist, a musical genre, a particular recording type, etc. for a song currently in playback.

Block S210 of the second method S200 recites identifying a song in playback through an audio output device of a user. Generally, Block S210 functions to identify one or more details of a song currently in playback through the user's audio device, such as the title, album, songwriter, composer, artist, musical genre (e.g., country, grunge, classical, etc.), recording type (e.g., live or studio), recording location (e.g., particular venue location), etc. In one example, Block S210 extracts one or more of the foregoing data from meta data stored digitally with the music file currently in playback and/or a from folder data containing the music file, and Block S210 can further apply this extracted data to retrieve additional song-related data from an external database (e.g., over an Internet connection to an online music database). In another example, Block S210 implements music identification software to create an acoustic fingerprint of the song in playback (or in a playback queue) and to identify the track by matching the acoustic fingerprint to a song fingerprint database. In yet another example, Block S210 prompts the user to supply any of the foregoing song data. In this example, Block S210 can retrieve song data previously entered by the user and stored on the audio device or connected device.

Block S210 can identify the song-related data substantially in real time, that is, once playback of the song begins. Alternatively, Block S210 can identify the song in a playback queue (e.g., "on deck" or "in the hole"), that is, before the song begins. Block S210 can additionally or alternatively implement similar methods or techniques to identify other types of audio, such as a lecture, a speech, an audio track of a film, etc. However, Block S210 can function in any other way to identify the song or other audio track.

Block S220 of the second method S200 recites retrieving an audio preference for the song from a database including stored song preferences for multiple users. Generally, Block S220 functions to implement song-related data identified in Block S210 to collect an audio preference pertinent to the song (or other audio file) and to the user. As described above, Block S220 can access a remote database containing audio preferences of various other users and then select particular audio preferences that pertain to the particular song title, album, songwriter, composer, artist, musical genre, recording type, and/or recording location, etc. identified in Block S210. Block S220 can also retrieve an audio preference based on the user's hearing profile, a demographic of the user, a user activity, the user's location, an ambient noise or environmental condition, etc. For example, Block S210 can retrieve an audio preference that defines a preferred EQ setting for a particular song, a preferred volume level given a particular ambient noise level, and/or a preferred filter or effect (e.g., reverb, chorusing, etc.) for the particular song. Block S210 can also filter stored audio preferences based on audio preferences supplied by users with hearing profiles similar to the user's hearing profile. Block S220 can thus aggregate a user's audio preferences for a set of songs into global settings for musical genres and physical locations (e.g., based on common metadata in digital song files and GPS locations output from a GPS sensor within the user's mobile computing device). For example, the second method S200 can apply location-specific user preferences for a particular classic rock song to all classic rock played through the mobile computing device based on the location of the mobile computing device during such playback.

Block S220 can therefore interface with an audio service that enables users to adjust and/or upload audio preferences for particular songs, artists, genres, recording types, user locations, ambient noise levels, etc. For example, the audio service can include a native music playback application executing on a smartphone, wherein the native music playback application displays a left and right volume sliders, EQ sliders, and/or effects toggles (e.g., for various reverb effects, chorusing, distortion, etc.), applies volume, EQ, and/or effects settings to audio in playback, and tags the audio with the volume, EQ, and/or effects settings. The native music playback application can then push the volume, EQ, and/or effects settings to a remote server associated with the audio service wherein the audio settings are stored as audio preferences and tagged with corresponding demographic data, environmental data, ambient noise data, etc. The audio service can thus populate a database of audio preferences from personalized audio settings entered by various users while listening to audio playback. (The audio service can also store an audio preference for a particular song, location, environmental condition, etc. for a user such that the audio preference can be shared across multiple devices associated with the corresponding user, such as the user's smartphone, laptop computer, home stereo, and car stereo.)

In one implementation, Block S220 initially filters audio preferences stored in the database according to a particularly general song characteristic and continues to filter audio preferences according to more specific song characteristics. For example, Block S220 can initially filter stored audio preferences according to audio genre (e.g., music, lecture, film audio track, etc.), then musical genre, followed by artist, then album, song title, recording type, recording location, etc. In this example, Block S220 filters stored audio preferences according to substantially more-specific song details as both additionally song details are made available and multiple hits remain for subsequently more-specific filter terms. Once a single audio preference is identified for a particular song, Block S220 can pass the audio preference to Block S230. Alternatively, Block S220 can combine multiple audio preferences, such as two or one hundred relevant audio preferences into an average or general audio preference for the song and then pass this average or general audio preference to Block S230. For example, Block S220 can filter stored audio preferences pertinent to the song down to approximately fifty audio preferences, each from a different user, and Block S220 can identify and remove outliers from the approximately fifty audio preferences, identify patterns within the remaining audio preferences, generate a composite audio preference based on the remaining audio preferences and the identified patters, and pass the composite audio preference to Block S230. Block S220 can therefore implement a target number of returned results for the song by applying additional song data to the filter (or search string) until the target number of audio preferences related to the song it returned.

Block S220 can also implement user demographic data to select an audio preference relevant to the user. For example, Block S220 can filter stored audio preferences according to an age, gender, ethnicity, location, occupation, relationship or marital status, income level, interest (e.g., audiophile or not an audiophile), or other demographic shared by the user and other users corresponding to stored audio preferences. For example, each audio preference can be tagged with demographic information of a corresponding user, and Block S220 can retrieve demographic information from an audio profile or online social networking profile of the user and then filter the stored audio preferences according to matches between the demographic tags and retrieved demographic information of the user.

Block S220 can similarly filter stored audio preferences according to the user's current environment, location, ambient noise level, local acoustics, a time of day, a current user activity, a current user listening volume, etc. In one example, Block S220 interfaces with a GPS sensor within the user's smartphone (and connected to the user's headphones) to determine the user's location, then accesses a database of local acoustics for the determined location and identifies stored audio preferences tagged with locations exhibiting similar room acoustics (or tagged with the same or similar location). In another example, Block S220 interfaces with a microphone within the user's smartphone to measure local ambient noise and then identifies stored audio preferences tagged with similar ambient noise levels. In yet another example, Block S220 interfaces with an accelerometer and/or gyroscope within the user's smartphone to collect user motion data, determines a current user action or activity (e.g., walking, exercising, working at a desk, etc.) based on the user motion data, and then identifies stored audio preferences tagged with similar actions or activities. However, Block S220 can filter stored audio preferences according to any other user-, environmental-, or song-related data.

Block S230 of the second method S200 recites adjusting an audio output profile for the audio output device in accordance with the audio preference for the song. Generally, Block S230 functions to implement one or more EQ settings, volume settings, effect settings, etc. in an output profile of the audio device. For example, Block S230 can combine the audio preference(s) retrieved in Block S220 with the user's hearing profile (as described in U.S. Provisional Application No. 61/763,163) and/or a sound response profile of the audio device (as described in U.S. Provisional Application No. 61/763,182) to generate a composite audio output profile that accommodates the user's hearing capacity, the output response of the audio device, and the audio preference(s) retrieved for the particular song (or genre, artist, album, etc.), such as described above.

Block S230 can also account for stored preferences, and/or hearing sensitivities, etc. of the user when generating the new audio output profile for the song. For example, if the user is particular sensitive to high-frequency sounds about a certain volume threshold, Block S230 can attenuate a distortion effect—defined in a retrieved audio preference—that otherwise boosts high-frequency sounds. However, Block S230 can function in any other way to adjust an audio output profile for the audio output device based on the audio preference retrieved in Block S220.

Block S240 of the second method S200 recites submitting the adjusted audio output profile to the audio device. In one implementation, Blocks of the method are implemented locally on a smartphone (or other mobile computing device), and Block S220 interfaces with a remote database to retrieve the audio preference(s). In this example, Block S240 transmits the adjusted audio profile to a set of "smart" headphones connected to the smartphone, such as wirelessly over Bluetooth communication between the smartphone and the headphones or over audio-based digital communication through an audio plug of the headphones inserted into a jack of the smartphone. Once the adjusted audio output profile is received from the smartphone, the headphones can apply the audio output profile (e.g., as a filter) to audio signals transmitted over the wired audio jack (i.e., song).

In another example, Blocks of the method care implemented remotely, such as with a remote database or distributed computer network connected to the user's audio device over a network connection (e.g., the Internet). In this example, song files can be streamed to the user's audio device for playback over the network connection, and Block S220 can thus retrieve user demographic data from a user profile stored on the remote database and the collect user location and/or environmental data directly from the user's audio device. Block S230 can also retrieve the user's hearing profile and/or audio device output profile directly from the user's audio device, or Block S230 can receive an identifier of the user and of the audio device from the audio device and then retrieve the user's hearing profile and a general audio output profile of the audio device from a remote database. Once Block S230 combines the audio device output profile, the user's hearing profile, and the audio preference(s) selected in Block S220 into the composite audio output profile, Block S240 can transmit the composite audio output profile back to the audio device. The audio device can then implement the composite audio output profile during playback of the particular song, the particular album, songs of the same or similar genre, etc. However, Block S240 can function in any other way to submit the adjusted audio output profile to the audio device and/or to implement the adjusted audio output profile.

The second method S200 can execute in substantially in real time to modify an audio output profile of the audio device for a particular song while the particular song is in playback. The second method S200 can additionally or alternatively modify the audio output profile of the audio device for the particular song when the particular song is about to enter playback. Furthermore, the second method S200 can additionally or alternatively execute to update the audio output profile when a particular genre of music, a particular album, or a particular artist, etc. is in playback or about to enter playback. However, the second method S200 can function in any other way to modify an audio output profile of an audio device based on a user hearing profile, an audio device output response, and an audio preference of another user.

3. Third Method and Applications

Figure 6:
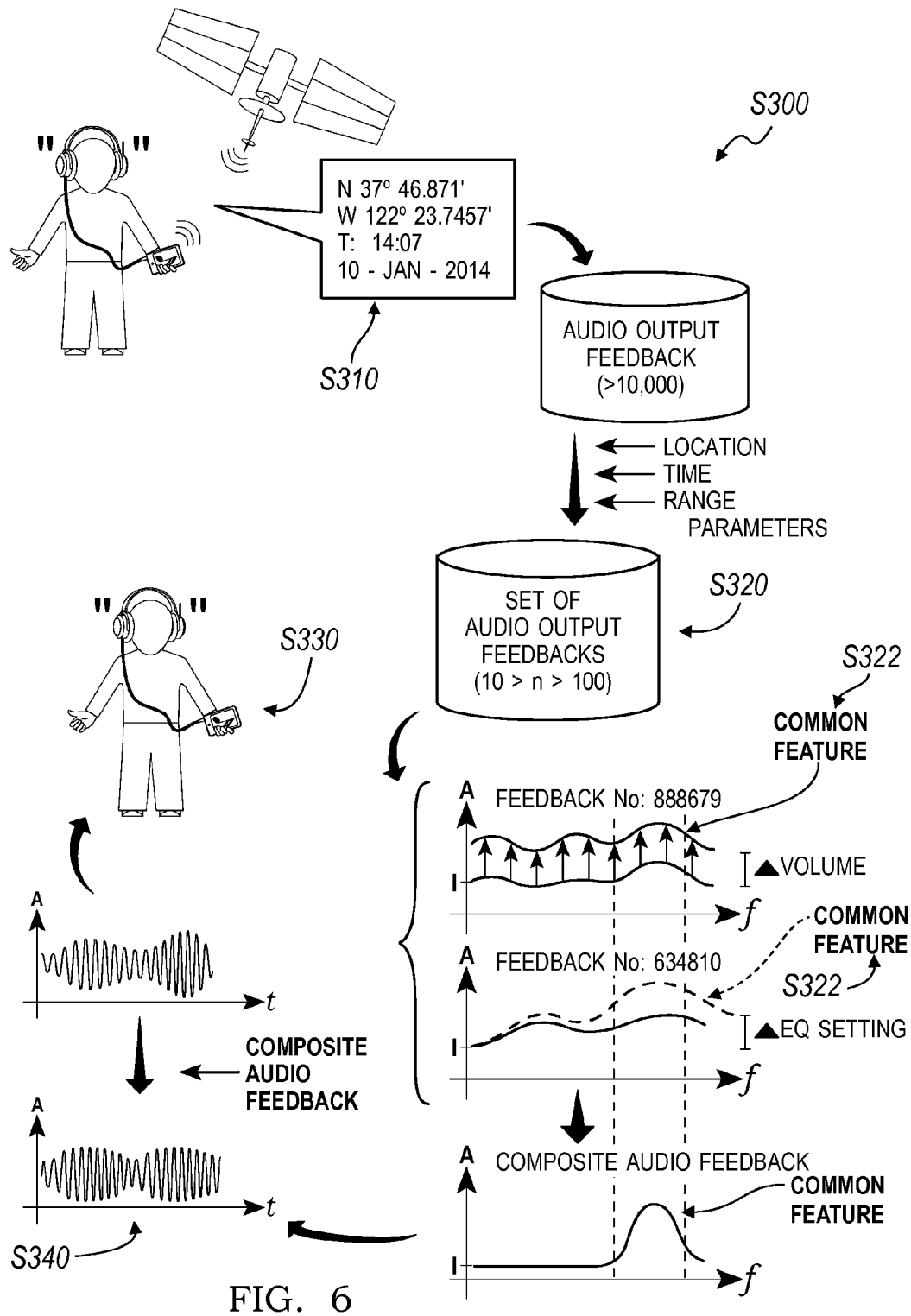
FIG. 6 is a flowchart representation of a third method in accordance with the invention.

As shown in FIG. 6, a third method S300 for augmenting a listening experience of a user through an audio device includes: detecting a location of the audio device in Block S310; selecting a set of audio output feedbacks in Block S320, each audio output feedback in the set of audio output feedback entered by an individual and associated with a physical site proximal the location; identifying a common feature across audio output feedbacks within the set of audio output feedbacks in Block S322; transforming an audio signal into a processed audio signal according to a hearing profile of the user and the common feature in Block S340; and outputting the processed audio signal through the audio device in Block S350.

Figure 7:
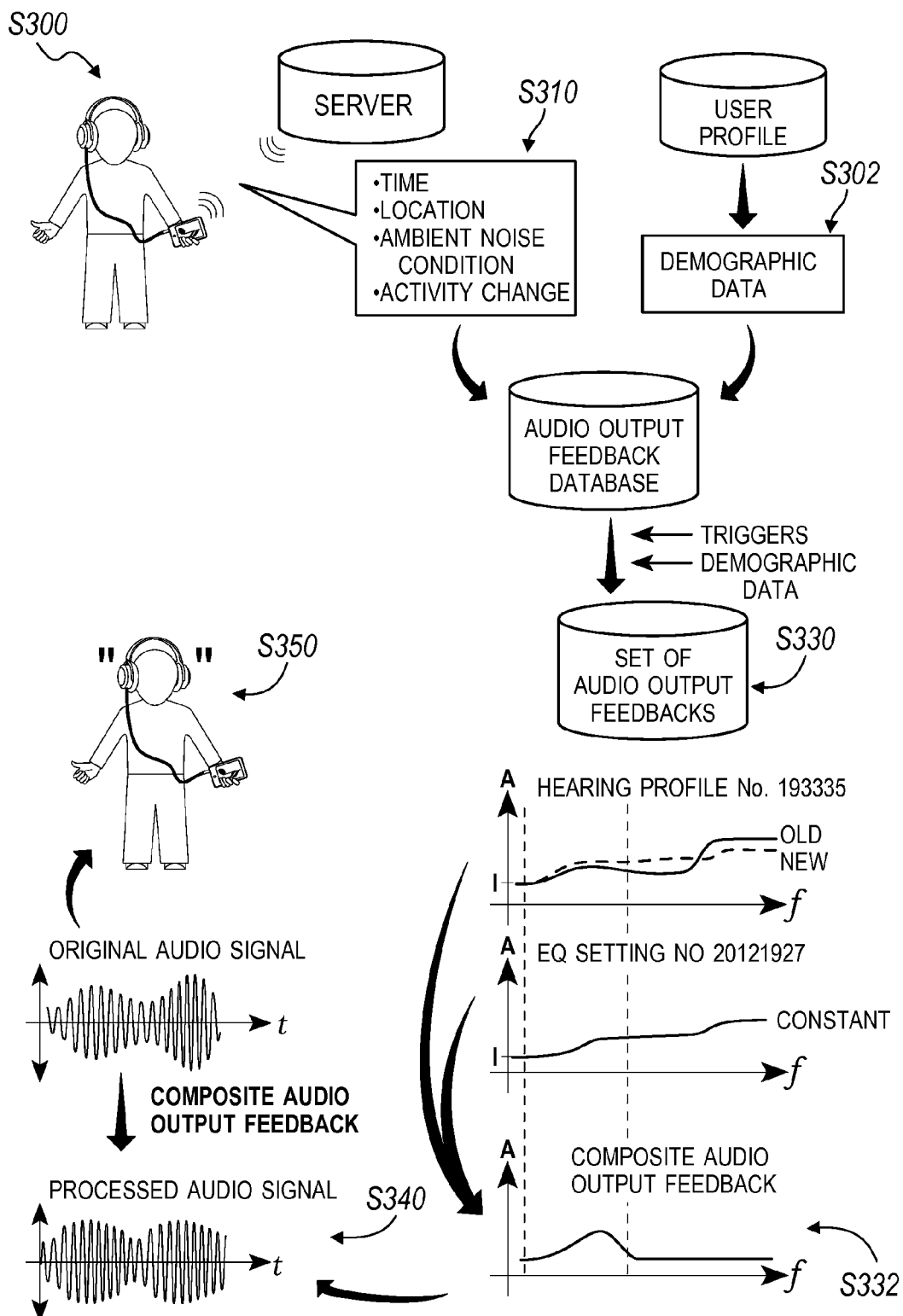
FIG. 7 is a flowchart representation of one variation of the third method.

As shown in FIG. 7, one variation of the third method S300 includes: detecting a trigger event at the audio device in Block S310; retrieving a demographic of the user in Block S302; selecting a set of audio output feedbacks in Block S330, each audio output feedback in the set of audio output feedbacks entered into a device, at a previous event consonant with the trigger, by an individual of known demographic consonant with the demographic of the user; generating a composite audio output feedback including audio output feedbacks from the set of audio output feedbacks in Block S332; transforming an audio signal into a processed audio signal according to a hearing profile of the user and the composite audio output feedback in Block S340; and outputting the processed audio signal through the audio device in Block S350.

Generally, the third method S300 functions to adjust an audio output profile (e.g., volume and/or equalizer (EQ) settings) of a user's audio device based on audio output feedback supplied by other individuals substantially in real-time as the user experiences events or triggers indicating a change in hearing need. In one example implementation, the third method S300 executes within a native hearing augmentation application executing on a user's smartphone, and, when the user enters a café wearing earbuds connected to the smartphone, the third method S300 modifies an audio output profile of the smartphone (e.g., a volume and/or EQ setting) based on audio feedback previously supplied by other individuals in or near the café. The third method S300 then applies the updated audio output profile to an audio signal output from the smartphone to the earbuds to compensate for a changing ambient noise level, room sound response, distraction level or commotion, etc. near the user as the user enters the café. For example, the third method S300 can apply the updated audio output profile to prerecorded audio played through the earbuds, to ambient noise recorded by at the smartphone and played back to the user through the earbuds substantially in real-time, or to incoming sound output to the earbuds during a phone call. In another example implementation, the third method S300 executes on a pair of "smart" headphones and functions to modify an audio output profile of the headphones based on audio feedback previously supplied by other individuals experiencing nearby changes in ambient noise level, room sound response, distraction level, or commotion substantially similar to that detected or anticipated near the user. In this example implementation, the third method S300 then processes an input (digital) audio signal according to the updated audio output profile, and the headphones output the processed audio signal in audible form for the user.

One or more Blocks of the third method S300 can alternatively execute on a computing network (e.g., a remote server), in communication with the user's audio device, such as over an Wi-Fi or cellular connection. Blocks of the third method S300 can also execute within a native application, at a system-level process, on a dedicated integrated circuit, or in any other way on or within one or more audio devices (e.g., a smartphone, a tablet, a laptop computer, a desktop computer, a car stereo system, a pubic address (PA) system, an MP3 player, a headset, and/or a pair of headphones or earbuds, etc.).

The third method S300 initially identifies one or more triggers for automatically adjusting an audio output of an audio device carried by the user. For example, Block S310 can detect time of day, a location, an ambient noise condition, a prerecorded or real-time local audio source, or other trigger, and subsequent Blocks of the third method S300 apply the detected trigger(s) to select (from a database) particularly relevant audio output feedbacks previously submitted by other users to and then automatically apply features from these relevant audio output feedbacks to the audio output profile of the user's audio device to adjust (e.g., improve) the user's current listening experience.

In particular, Blocks S320, S330, etc. access audio output feedbacks submitted previously by other individuals (i.e., other users) in response to detected prompts exhibiting a correlation (i.e., a statistical significance) with the one or more detected triggers. In one implementation, these Blocks of the third method S300 select audio output feedback including explicit feedback in the form of a manual audio adjustment—such as a volume adjustment, an equalizer (EQ) adjustment, and/or a hearing test, etc.—entered by user into personal audio devices, such as smartphones, tablets, personal music players (i.e., MP3 players), headsets (e.g., a Bluetooth headsets), or headphones or earbuds. Blocks of the third method S300 can also select audio output feedback including implicit feedback in the form of no audio adjustment—that is, no entered volume or equalizer setting change—in response to a detected event, which can indicate a corresponding individual's satisfaction with a current audio output profile implemented on his corresponding audio device for the detected trigger(s).

Blocks of the third method S300 can then select and/or filter stored audio output feedbacks associated with events exhibiting some degree of correlation with the trigger(s) detected in Block S310, extract common and/or relevant features from the selected audio output feedbacks, and apply the common and/or relevant features to a current audio output of the user's audio device. Blocks of the third method S300 can further filter or select stored audio output feedbacks based on the user's hearing ability (as defined in a hearing test completed by the user), a demographic of the user, the user's human associations (e.g., friends or family members), and/or similarities between audio output feedback entered by the user and by the other individuals associated with stored audio output feedbacks.

The third method S300 can thus detect a trigger for an automated audio output adjustment on a user's audio device, access previous audio output feedback entered by other individuals at events consonant with the trigger, and selectively apply features of the audio output feedbacks of other individuals to an audio output on the user's device substantially in real-time, thereby automatically updating audio output from user's audio device with audio output-related data leveraged from other individuals as the environment around the user changes.

3.1 Triggers

Block S310 of the third method S300 recites detecting a trigger event at the audio device. Generally, Block S310 functions to detect one or more triggers indicating a changing hearing need of the user, such as a location-based trigger, a time (of day)-based trigger, and ambient noise condition trigger, or a user activity-related trigger. Block S310 can also detect multiple triggers simultaneously or over a limited or preset period of time and thus prompt Block S320 and/or Block S330 to select audio output feedbacks accordingly.

In one implementation, Block S310 detects a location of the user's audio device. For example, in this implementation, Block S310 can execute on an audio device incorporating a Global Positioning System (GPS) sensor, such as a smartphone or a tablet, and Block S310 can thus interface with the GPS sensor to determine the current location of the audio device and therefore the user who is associated with the audio device. Additionally or alternatively, Block S310 can interface with a wireless communication module (e.g., a Wi-Fi card or a cellular communication chip) to estimate a location of the audio device, such as based on a Wi-Fi signal strength between the audio device and a wireless router of known location or by triangulating the audio device between three cellular towers. Block S310 can further map a GPS or coordinate position of the audio device to a particular location, such as a particular address, a particular business, or a particular space (e.g., park) or room (e.g., in an office) frequented by the user, etc. For example, Block S310 can determine that the user has entered a café, entered a theater, is in his office, is at home in his kitchen, is walking around a park, is walking on a sidewalk on a particular street, or is in his car, is riding in a train car, etc. However, Block S310 can interface with any other sensor and can function in any other to detect a location of the user. Thus, in this implementation, Block S320 and/or Block S330 can select a set of audio output feedbacks wherein one or more audio output feedbacks in the set of audio output feedback is associated with a physical site proximal the location.

In another implementation, Block S310 identifies a present time of day, such as by retrieving a current time through a GPS or cellular sensor within the audio device (e.g., a smartphone). Block S310 can then interface with a set of time-related prompts stored locally on the audio device or remotely in a database (e.g., on a remote server) to classify the current time as a trigger event. In one example implementation, once the location of the audio device is detected, Block S310 accesses a set of time-related triggers for the location. In one example, Block S310 can determine that the user is currently in a café and access a set of times corresponding to anticipated changes in ambient noise condition within the café. Thus, if Block S310 determines that the user entered the café at 11:30AM—a quiet period for the café—but the time is now 12:15PM—a busy period for the café—Block S310 can correlate the current time and location of the user with a trigger event. In this example, Block S310 can thus prompt Block S320 and/or Block S330 to select an audio output feedback entered by an individual on a previous date at a time of day within a threshold time of the present time of day such that audio output feedback from one or more other individuals experiencing similar ambient environments within the café can be applied to the audio output of the user's audio device. In this implementation, Block S310 can define schema for mapping a present time to an entry time (or timestamp) of an audio output feedback previously entered by another individual. For example, Block S310 can trigger Block S220 and/or Block 230 to select audio output feedback entered on a same day of the week or on one of a corresponding weekday or corresponding weekend and within a particular threshold period of time, such as within fifteen minutes for densely-populated spaces (e.g., a café during a lunch hour) and four hours for sparsely-populated spaces (e.g., a large park). However, Block S310 can function in any other way to detect a time-related trigger.

In another implementation, Block S310 detects a local ambient noise condition proximal the user and prompts Block S320 and/or Block S330 to selecting an audio output feedback associated with a previous ambient noise condition based on the detected ambient noise condition proximal the user. For example, Block S310 can interface with a microphone with the audio device (e.g., a smartphone) and/or with a microphone within a connected device (e.g., a pair of earbuds or headphones) to record ambient sound and then characterizes the ambient sound as a current ambient noise condition. When the current ambient noise condition exhibits a substantial changes over a recent ambient noise condition detected proximal the user or when the current ambient noise condition matches a model ambient noise condition (e.g., a model associated with a particular population density within a space occupied or a model associated with a particular sound response a space), Block S310 can trigger Block S320 and/or Block S330 to retrieve corresponding audio output feedbacks. Therefore, Block S310 can trigger subsequent Blocks of the third method S300 based on an absolute ambient noise condition proximal the user and/or based on a change in ambient noise condition proximal the user.

In yet another implementation, Block S310 detects a change in the user's current activity and triggers Block S320 and/or Block S330 to select audio output feedback entered by an individual within a threshold period of time from a detected change in action consonant with the detected change in the user's activity. For example, Block S310 can interface with an accelerometer, gyroscope, magnetometer, and/or GPS sensor within a smartphone, wearable device, headset, or other device worn or carried by the user to characterize a current user action. In this example, Block S310 can determine that the user is walking, driving, riding a bike, running, exercising, working at a desk, eating, drinking, or performing any other action—any of which can be paired with a location—and compare the detected current action to a previous action to determine if the user's current activity has changed, which can indicate a change in the user's present hearing needs. Thus, Block S310 can trigger subsequent Blocks of the third method S300 to adjust the audio output of the user's audio device to meet the user's new activity-related hearing need. For example, Block S310 can pass the current detected user activity to Block S320 and/or to Block S330, either of which can implement the user activity to select audio output feedbacks entered by other individuals performing the same or similar activity, such as at the same or similar location.

However, Block S310 can function in any other way to detect any other one or more triggers indicating a change in the user's hearing needs, and Block S310 can function in any other way to prompt subsequent Blocks of the third method S300 to update the audio output profile of the user's audio device accordingly in any other suitable way.

3.2 Common Features

Block S320 of the third method S300 recites selecting a set of audio output feedbacks, each audio output feedback in the set of audio output feedback entered by an individual and consonant with the trigger. Generally, Block S320 functions to identify one or more audio output feedbacks previously submitted by other individuals near a location, around a time, during an ambient noise condition, and/or around an activity change substantially similar to one or more triggers identified in Block S310.

Each audio output feedback can be previously entered (implicitly or explicitly) by another individual into a corresponding audio device, such into a smartphone, tablet, earbuds, or other associated audio device. For example, as described above, an explicit audio output feedback can include manual audio adjustment of audio output from an audio device (e.g., smartphone, MP3 player, earbuds), such as a volume adjustment, an equalizer adjustment, or a hearing test, entered by a corresponding individual soon before, during, or substantially soon after a trigger event. Furthermore, as described above, implicit audio output feedback can exclude an audio adjustment in response to a detected trigger event, which can indicate a corresponding individual's satisfaction with a current audio output profile executing on his audio device.

Feedback thus entered by an individual can be transmitted to a computer network and collected into and stored in a database. Metadata, such as an individual identifier (e.g., a user name of ID), a time, a date, an ambient noise condition, an action or activity performed by the user, or other trigger occurring with or substantially near submission of corresponding feedback can also be stored with corresponding feedback. Block S320 can thus selecting audio output feedback from the database by matching one or more triggers detected in Block S310 to one or more consonant metadata associated (e.g., tagged or stored) with corresponding audio output feedbacks. For example, Block S320 can execute on the user's audio device and download select the audio output feedbacks from a remote database storing a multitude of audio output feedbacks. Alternatively, Block S320 can execute directly on the computer network, and Block S332 or Block S340—also executing on the computer network—can upload the common feature(s) or the processed audio signal, respectively, to the user's audio device.

In one implementation, Block S320 selects a set of audio output feedbacks, each audio output feedback in the set of audio output feedback entered by an individual and associated with a physical site proximal the location. For example, Block S320 can analyze location metadata stored with a (large) group of audio output feedbacks within a database to identify a set (i.e., a subset of the group) of audio output feedbacks corresponding to sites at or near the location. Specifically, Block S320 can analyze trigger data stored with audio output feedbacks to filter audio output feedbacks in the dataset down to audio output feedbacks submitted by individuals at or near the location identified as a triggering Block S310. In this implementation, Block S320 can apply a static range to comparison of the user's location to location metadata stored with the audio output feedbacks, such as twenty meters for all location. Alternatively, Block S320 can apply a static ranges specific to locations or to particular location types, such as ten meters for all cafés (or for a particular café) and fifty meters for all sport stadiums with seating capacity over 30,000 people.

Yet alternatively, Block S320 can dynamically adjust a range for the location detected in Block S310 to achieve a target number of selected audio output feedbacks related to the location. For example, each audio output feedback in the database can be associated with a GPS coordinate, Block S310 can pass a GPS coordinate of the user to Block S320, and Block S320 can parse through the database of audio output feedback to identify select audio output feedbacks with a minimum threshold range of the user's location. In this example, if a minimum number of audio output feedbacks (e.g., twenty) is not returned for the minimum threshold range, Block S320 can increase the threshold range until the minimum number of audio output feedbacks is returned. As in this example, Block S320 can set a static target or minimum number audio output feedbacks for all locations (e.g., twenty). Alternatively, Block S320 can set location-specific target or minimum audio output feedbacks (e.g., five for a small office space, twenty for a café, and two hundred for a large amphitheater), or Block S320 can dynamically adjust target or minimum audio output feedbacks, such as based on time of day. Therefore, in this implementation, Block S320 can select audio output feedbacks submitted by individuals into corresponding devices at physical sites within the range of the location, and Block S320 can adjust the range to realize a target minimum number of audio output feedbacks in the set of audio output feedbacks. However, Block S320 can function in any other way to identify and/or select audio output feedbacks consonant with the user's location as detected in Block S310.

Block S320 can implement similar functionality to select the set of audio output feedbacks from the database of audio output feedbacks based on one or more other triggers detected in Block S310. For example, Block S320 can filter the database of audio output feedbacks for audio output feedbacks entered at times of day and on a day of the week consonant with a time-based trigger detected in Block S310. In another example, Block S320 can filter the database of audio output feedbacks for audio output feedbacks entered shortly before, during, or after a transition into a local ambient noise condition consonant with (e.g., similar to) an ambient noise-related trigger detected in Block S310. Block S320 can also filter the database of audio output feedbacks for audio output feedbacks entered shortly before, during, or after a corresponding individual transitions into an activity consonant with an activity-related trigger detected in Block S310.

Block S320 can also select the set of audio output feedbacks from the database of audio output feedbacks based on multiple triggers detected in Block S310. In one implementation, Block S320 can select the set of audio output feedbacks entered at a site within a distance range of a location-based trigger detected in Block S310 and entered at a time of day within a threshold time range of a time-based trigger detected in Block S310. For example, Block S310 can determine that the user has entered a café at 12:03PM on a Tuesday, and Block S320 can select audio output feedbacks entered within a threshold range of ten meters from the user's location between 11:48AM and 12:18PM on weekdays over the past two months. As in this example, Block S320 can set general or time (of day)-specific static time ranges, or Block S320 can dynamically adjust the time range to achieve a target number of audio output feedbacks with time-related triggers consonant with the time-related trigger detected in Block S310. Block S320 can also dynamically adjust the time range and the distance range together to achieve the target number of audio output feedbacks.

In a similar implementation, Block S320 can select the set of audio output feedbacks entered at a site within a distance range of a location-based trigger detected in Block S310 and associated with an ambient noise conditions with a decibel range over a frequency range consonant with an ambient noise condition detected in Block S310. For example, Block S310 can determine that the user has entered a café at an average noise level of 70 dB, and Block S320 can select audio output feedbacks entered at sites within a threshold range of twenty meters from the user's location and exhibiting a noise level between 68 dB and 75 dB. As in this example, Block S320 can set general or environment-specific static noise level ranges, or Block S320 can dynamically adjust the noise level range to achieve a target number of audio output feedbacks with noise-related triggers consonant with the time-related trigger detected in Block S310. However, Block S320 can pair ambient noise conditions proximal the user with ambient noise conditions stored with audio output feedbacks in any other way.

In another implementation, Block S320 can select the set of audio output feedbacks entered within a threshold time range of a change in detected action, the detected action of at least a threshold confidence level and consonant with the user action detected in Block S310. In particular, an individual can enter audio output feedback while motion data is collected at a wearable device and/or a smartphone; this motion data can then be analyzed to estimate the individual's present action, such as walking, running, eating, exercising, working, watching television, etc., with a statistical confidence interval. The estimated action and corresponding confidence interval can be stored with the audio output feedback (e.g., as metadata). For example, Block S310 can determine that the user has transitioned to walking down a city street, and Block S320 can select audio output feedbacks associated with walking with a minimum threshold confidence interval. Block S320 can also dynamically adjust the minimum threshold confidence interval to achieve a target number of audio output feedbacks in the set. Block S310 can also detect the particular street or intersection at which the user is located, and Block S320 can further filter the database of audio output feedbacks for other audio output feedbacks associated with sites within a threshold range of the particular street or intersection. Block S320 can additionally or alternatively select audio output feedbacks entered at a time of day within a time range of the current time of day, as described above, or match the ambient noise condition proximal the user to ambient noise conditions associated with audio output feedbacks in the database to select the set of audio output feedbacks, as described above.

However, Block S320 can apply and other trigger detected in Block S310 to the database of audio output feedbacks to select the set of audio output feedbacks associated with a location, time, ambient noise condition, and/or activity, etc. consonant (e.g., substantially similar or within a suitable range of) a user location, time, ambient noise condition, and/or activity, etc. detected in Block S310.

Block S322 of the third method S300 recites identifying a common feature across audio output feedbacks within the set of audio output feedbacks. Generally, Block S322 functions to identify commonalities across the audio output feedbacks selected in Block S320 (e.g., common volume changes or common EQ setting changes correlated with the triggers(s)) and to pass these detected commonalities as features to Block S340. Block S340 can thus implement these features automatically to process an audio signal at the user's audio device with audio output changes commonly made by other individuals (statistically likely) in response to the detected trigger (s).

Once Block S320 selects the set of audio output feedbacks, Block S322 analyzes and compares all or a subset of the audio output feedbacks to identify commonalities in audio adjustments made in response to (or correlated with) one or more corresponding triggers. As described above, the audio output feedbacks can include volume adjustments, EQ adjustments, and/or hearing tests, etc., and Block S322 can identify common adjustments made across a full audible range, one or more frequency ranges within the audible range, or one or more particular frequencies within the audible range.

In one implementation, Block S320 retrieves a first audio output feedback and a second audio output feedback from the database, wherein the first audio output feedback includes a volume adjustment submitted by a first individual into a first device proximal (e.g., with a specified range of) the location, and wherein the second audio output feedback includes an equalizer adjustment submitted by a second individual into a second device proximal the location, as shown in FIG. 6. In this implementation, Block S322 identifies a volume change over a particular frequency range common to the first audio output feedback and the second audio output feedback. For example, Block S322 can identify a particular frequency range (i.e., a continuous subset of frequencies in the audible range) adjusted for a higher amplitude output in the second audio output feedback and then map this to an static volume increase over the whole audible range in the first audio output feedback, and Block S322 can thus pass the amplitude increase across the particular frequency range to Block S340, which can then apply the volume change over the particular frequency range to the audio signal at the user's audio device. In a similar example, Block S322 can identify a particular frequency range adjusted for a relatively lower amplitude output in the second audio output feedback and then map this to an static volume increase over the whole audible range in the first audio output feedback, and Block S322 can thus pass the static volume increase across the audible range excluding the particular frequency range to Block S340, which can then apply the volume change over the audible range excluding the particular frequency range to the audio signal at the user's audio device.

In a similar implementation, Block S320 selects a first audio output feedback and a second audio output feedback, wherein the first audio output feedback includes a first equalizer setting adjustment entered manually by a first individual into a first computing device, and wherein the second audio output feedback includes a second equalizer setting adjustment entered manually by a second individual into a second computing device and substantially similar to the first equalizer setting adjustment. In this implementation, Block S322 can aggregate the first and second equalizer settings into a composite equalizer setting adjustment, such as by averaging amplitude adjustment at each frequency in the audio range between the first and second equalizer settings. Alternatively, as in the foregoing implementation, Block S322 can identity similar amplitude adjustments—defined in the first and second equalizer settings—over similar frequencies ranges within the audible range and combine these similar amplitude adjustments into a composite amplitude adjustment for an intersection of the similar frequencies ranges. Block S340 can subsequently apply the amplitude adjustment (i.e., a relative volume change) over the corresponding frequency range in the audio signal for the user.

As shown in FIG. 7, Block S320 can also retrieve an audio output feedback including submitted a hearing test into a computing device by an individual proximal the location. In this implementation, the audio output feedback in the database can include a hearing profile generated with a hearing test completed by the corresponding individual, as described in U.S. patent application Ser. No. 14/178,034, filed on 11 Feb. 2014 which is incorporated in its entirety by this reference. In particular, the hearing profile can define how well the individual hears sounds at frequencies within the audio range and can be sensitive to local ambient noise conditions, a sound response of a space occupied by the individual, and/or other variables. The audio output feedback can also include a previous hearing profile applied by the individual's device prior to completion of the hearing test to generate the new hearing profile. Block S322 can thus identify difference between the new hearing profile and the previous hearing profile (e.g., equalizer and/or volume changes over all or a portion of the audible range), define these differences as implicit feedback from the individual, and compare this implicit feedback to other audio output feedbacks in the set of audio output feedbacks.

Block S320 and/or Block S322 can also access hearing profiles of individual associated with audio output feedbacks in the set and normalize each audio output feedback according to the hearing profile of the corresponding individual. For example, for an individual with significant hearing loss at low frequencies but acute hearing sensitivity at high frequencies, Block S322 can normalize an EQ setting for higher frequencies entered by the individual by applying the same adjustment across the lower frequencies in the audio output feedback. Block S322 can subsequently identify common features within a set of normalized audio output feedback.

Block S320 can further retrieve an audio output feedback characterized by a lack of explicit audio output adjustment entered into a first device proximal the location. For example, as described above, if an individual moves into a new location or if an ambient sound condition around the individual changes but the individual does not enter a volume, EQ, or other audio-related adjustment into his device or does not complete a hearing test, the unchanged audio settings on the individual's device can be stored with the corresponding trigger as implicit feedback indicating satisfaction with the audio settings despite the changing local environment around the individual. Block S322 can subsequently compare a static audio setting in such an implicit feedback with audio setting changes in explicit feedbacks to identify a common features within the set of audio output feedbacks. For example, Block can identify a relative amplitude difference between two frequency ranges in the static audio setting in the implicit feedback, identify a change in a second audio output feedback from another individual that mimics the difference between the two frequency ranges in the implicit feedback, and output the difference between the two frequency ranges to Block S340 as the common feature.

Furthermore, Block S322 can combine multiple (e.g., two, ten, one-hundred, etc.) audio output feedbacks from various individuals into one composite feature specifying an absolute or relative volume amplitude for one or more frequencies, one or more frequency ranges, or the entirety of the audible range. In this implementation, Block S322 can weight audio output feedbacks, such as based on feedback type (e.g., implicit feedback, a volume change, an EQ setting change, a hearing test), and then combine multiple audio output feedbacks into a single feature based on such weightings. For example, Block S322 can apply a first weight to implicit feedback from an audio output feedback lacking an EQ or volume change or a hearing test, a second weight greater than the first weight to a volume change in an audio output feedback, a third weight greater than the second weight to an EQ setting change in an audio output feedback, and a fourth weight greater than the third weight to a hearing test result (or associated hearing profile). Block S322 can thus prioritize features in the set of audio output feedback, select particular frequencies or ranges of frequencies of greatest need for adjustment, and/or remove outliers in the set of audio output feedback by prioritizing and comparing various audio output feedbacks based on audio output feedback types.

However, Blocks S320 and S322 can function in any other way to collect audio output feedback corresponding to (e.g., consonant with) any one or more triggers detected in Block S310 can to extrapolate one or more relevant features (e.g., audio adjustment characteristics) shared across or common to multiple audio output feedbacks in the set.

3.3 Relevant Features

Block S302 of the third method S300 recites retrieving a demographic of the user. Generally, Block S302 and S330 function, respectively, to collect one or more user demographic data. In one implementation, Block S302 implements methods or techniques described above in Block S220 to collect user demographic information. For example, Block S302 can retrieve an age, gender, home or work location, occupation, and/or ethnicity from a user profile connected to a native hearing augmentation application executing on the user's audio device. Alternatively, Block S302 retrieve personal information of the user and/or a list of contacts (e.g., family, friends) of the user from an online social networking system linked to the native hearing augmentation application executing on the user's audio device. However, Block S302 can function in any other to collect any other one or more demographic data of the user.

Block S330 recites selecting a set of audio output feedbacks, each audio output feedback in the set of audio output feedbacks entered into a device, at a previous event consonant with the trigger, by an individual of known demographic consonant with the demographic of the user. Generally, Block S330 functions to collect one or more user demographic data and to apply these user demographic data to selection of a set of audio output feedbacks supplied by other individuals of substantially similar demographic(s). Thus, by selecting particular audio output feedbacks from individuals sharing at least one demographic with the user, Block S330 can enable subsequent Blocks of the third method S300 to automatically identify and then apply audio adjustments common to the user's demographic.

In one implementation, Block S330 further filters the set of audio output feedbacks selected in Block S320 to identify a set of audio output feedbacks that are both consonant with the one or more triggers detected in Block S310 and associated with individuals of one or more demographics similar to those of the user. For example, Block S320 can select—from a database—a group of audio output feedbacks associated with sites with a range of the user's location, and Block S330 can cull the group into the set of audio output feedbacks submitted by individuals within the age group of the user. In this implementation, Blocks S322 and S332 can further cooperate to extrapolate a common feature from a set of audio output feedbacks associated with individuals related (e.g., by demographic or social relationship) to the user. Alternatively, Block S330 can implement methods and techniques similar to those of Block S320 to select a second set of audio output feedbacks submitted by individuals related to the user. Thus, in this alternative implementation, Block S332 can extrapolate a second feature (a "relevant feature") from the second set of audio output feedbacks, and Block S340 can process the audio signal at the user's audio device according to both the common feature identified in Block S322 and the relevant features identified in Block S332.

In one implementation, Block S302 retrieves an age of the user, and Block S330 selects audio output feedbacks entered by individuals within an age bracket that includes the age of the user. For example, Block S302 can determine that the user is 27 based on a birthdate stored in a user profile on an online social networking system linked to the native hearing augmentation application executing on the user's audio device, and Block S330 select audio output feedbacks submitted when corresponding individuals were of ages within a 25-30 year age bracket. In this implementation, Block S330 can implement methods similar to those of Block S320 to dynamically adjust the age bracket (i.e., the age range) to achieve a target number of relevant audio output feedbacks for the user's demographic. As in the foregoing example, Block S330 can expand the age bracket from 25-30 years to 23-31 years to yield a larger number of relevant audio output profiles. Block can similarly apply the user's gender, ethnicity, and/or other demographic to audio output feedbacks in the database to select the set of audio output feedbacks.

In another implementation, Block S302 retrieves a (recent) hearing profile of the user generated based on a hearing test performed by the user (e.g., as described in U.S. patent application Ser. No. 14/178,034) and applies the user's hearing profile to the database to select the set of audio output profiles entered by individuals with substantially similar hearing abilities. In particular, the hearing profile can define (or characterize) the user's hearing ability across all or a portion of the audible range, and Block S330 can select audio output feedbacks associated with individuals of known hearing abilities—defined or characterized in corresponding hearing profiles—substantially similar to the hearing ability of the user. For example, Block S330 can match relative volume adjustments entered by the user in response to playback of select tones during a hearing test—as described in U.S. patent application Ser. No. 14/178,034—to relative volume adjustments for select tones of similar frequencies as entered by other individuals during a corresponding hearing tests stored, linked, and/or associated with corresponding audio output feedbacks.

In the foregoing implementation, an audio output feedback in the database can be paired with a hearing test completed by and/or a hearing profile generated for the corresponding individual at a time nearest entry of the corresponding feedback by the individual, such as the hearing completed soonest before or soonest after entry of the feedback by the individual. Additionally or alternatively, the audio output feedback can be paired or linked to a hearing test completed by the individual at a location and/or at a time nearest the location and time of entry of the feedback by the individual. Yet additionally or alternatively, the audio output feedback can be paired or linked to a hearing test completed by the individual during a period of ambient noise condition most similar to an ambient noise condition detected proximal the individual when the feedback was entered by the individual.

Thus, in the foregoing implementation Block S330 can select audio output feedbacks entered by other individuals with hearing needs approximating the user's hearing needs as indicated by similarities between hearing test results of the individuals and hearing test results of the user.

In yet another implementation, Block S302 can retrieve an identifier (e.g., a name, a screen name) of one or more family member, friends, or other acquaintances (e.g., coworkers) of the user, and Block S330 can filter the database for audio output feedback entered by acquaintances of the user. In one example, Block S310 detects a trigger indicating that the user is in (or is about to arrive to) his office, and Block S302 retrieves a database of user contacts and selects work-related acquaintances of the user. Block S330 then selects—from the database—the set of audio output feedbacks previously entered by contacts in the set of work-related user acquaintances selected in Block S302.

However, Block S302 can retrieve any other one or more demographics of the user, and Block S330 can apply the selected demographic(s) to the database of audio output feedbacks in any other way to select the set of audio output feedbacks entered by individuals related to the user through the one or more demographics.

Block S332 of the third method S300 recites generating a composite audio output feedback including audio output feedbacks from the set of audio output feedbacks. Generally, Block S332 can implement methods and techniques similar to those of Block S322 described above to combine two or more audio output feedbacks selected in Block S330 into a composite audio output feedback, which can include one or more relevant audio-related features for subsequent application onto an audio signal output from the user's device (e.g., in Blocks S340 and S350).

3.4 Signal Processing and Output

Block S340 of the third method S300 functions to transform an audio signal into a processed audio signal based on audio output feedback selected in Block S320 and/or Block S330. In one variation, Block S340 includes transforming an audio signal into a processed audio signal according to a hearing profile of the user and the common feature in Block S340. In another variation, Block S340 includes transforming an audio signal into a processed audio signal according to a hearing profile of the user and the composite audio output feedback. Block S350, which recites outputting the processed audio signal through the audio device, functions to subsequently play (i.e., audibly output) the processed audio signal for the user through the user's audio device or connected device.

Generally, Block S340 applies a common audio-related feature selected in Block S322 and/or a relevant audio-related feature selected in Block S332—both generated from audio output feedback previously entered by other individuals—to an audio signal output from the user's audio device. Thus, Block S340 can automatically apply audio output changes—similar to audio output changes made by other users (statistically likely) in response to trigger events similar to those of the user and/or by individuals sharing some similarity with the user—to a current audio signal at the user's audio device. Block S350 can subsequently output the processor audio signal, now adjusted based on audio output feedback previously entered by other individuals, to compensate for a changing environment around the user substantially automatically and in real-time.

In one example, Block S340 transforms a prerecorded music signal into the processed audio signal, and Block S350 outputs the processed audio signal to a pair of headphones connected to the audio device. Block S340 can alternatively transform a live audio from a phone call on the user's smartphone into the processed audio signal, and Block S350 can output the processed audio signal through a built-in speaker within the smartphone. Yet alternatively, Block S340 can transform a live ambient noise signal—collected at a speaker in a pair of earbuds and transmitted into the user's smartphone—into the processed audio signal, and Block S350 can output the processed audio signal to the earbuds to augment (i.e., aid) the user in hearing ambient noise within a current space.

Block S340 can also implement any other methods or techniques of Block S140 described above to process a live or prerecorded audio signal, and Block S350 can similarly implement any other method or technique of Block S230 described above to output the processed audio signal. However, Block S340 can function in any other way to process the audio signal of any other type and according to any other feature(s), and Block S350 can function in any other way to output the processed audio signal through any other audio and/or connected device.

4. Fourth Method and Applications

Figure 8:
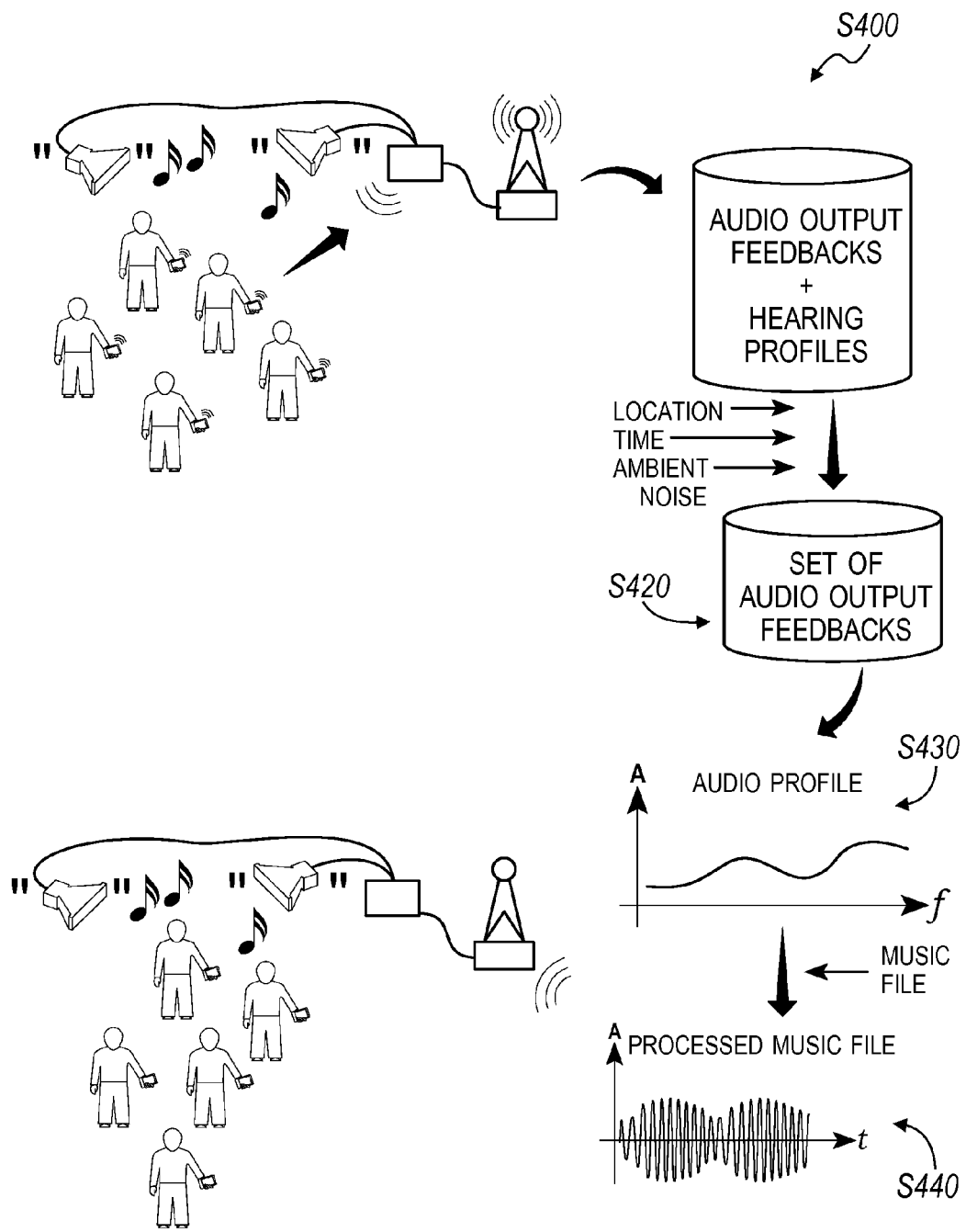
FIG. 8 is a flowchart representation of a fourth method in accordance with the invention.

As shown in FIG. 8, a fourth method S400 for augmenting a group listening experience includes: detecting a set of computing devices within a range of a location of an audio device in Block S410; retrieving a set of audio output feedbacks in Block S420, each audio output feedback in the set of audio output feedbacks entered into a computing device in the set of computing devices by an associated individual proximal the location; generating a composite audio output feedback from audio output feedbacks within the set of audio output feedbacks in Block S430; transforming a local audio signal into a processed audio signal according to the composite audio output feedback in Block S440; and outputting the processed audio signal through the audio device in Block S450.

Generally, the fourth method S400 can be implemented over an audio system projecting audio to two or more listeners to tailor an audio signal to hearing needs and/or preferences of the two or more listeners. In particular, the fourth method S400 detects computing devices (e.g., smartphones, tablets, Wi-Fi-enabled MP3 players, etc.) within or near a venue (or space), each device associated with a particular listener, retrieves hearing profiles and/or audio output feedback (i.e., audio preferences) from (or associated with) the computing devices, and applies the hearing profiles and/or audio output feedback to adjust a volume setting and/or EQ setting of the projected audio within the venue. For example, the fourth method S400 can be implemented within a café to tailor a volume level and/or an EQ setting of background music played within the café during business hours to hearing needs and/or preferences of customers within the café, and the fourth method S400 can be constantly or intermittently repeated to update the volume and EQ settings as patrons within the café come and go.

In another example, the fourth method S400 can be implemented within a theatre (e.g., a movie theatre, a drama theatre, an opera house) to tailor the volume and/or EQ settings of amplified audio for a particular audience during a particular showing or on a particular night, and the fourth method S400 can be repeated for each showing to accommodate differences in hearing needs and/or preferences among different audiences.

4.1 Device Detection

Block S410 of the fourth method recites detecting a set of computing devices within a range of a location of an audio device. Generally, Block S410 functions to detect computing devices local to a venue or space including an audio device, such as a café including a stereo system or a theatre including a large PA (public address) system. Block 410 can communicate and identify the devices over any suitable wireless communication protocol, such as Bluetooth, Wi-Fi, cellular, or GPS communication protocol. Block S140 can download an identifier for each detected device, such as a unique numerical sequence for each device, each numerical sequence associated with a particular user and corresponding user audio needs and/or preferences. However, Block S410 can retrieve any other suitable type or identify from each detected computing deice within or near the venue. Alternatively, Block S410 can trigger Block S420 to retrieve audio output feedback—such as volume changes, EQ changes, and/or hearing test results, as described above—from the computing devices directly.

4.2 Audio Output Feedbacks

Block S420 recites retrieving a set of audio output feedbacks, each audio output feedback in the set of audio output feedbacks entered into a computing device in the set of computing devices by an associated individual proximal the location. Generally, Block S420 functions to collects audio output feedbacks—such as implicit feedback, volume adjustments, EQ setting changes, and/or hearing test results—associated with computing devices detected in Block SS410.

In one implementation, Block S420 retrieves audio output feedback directly from the detected audio devices substantially in real-time. For example, as a user enters a volume or EQ change while within the current venue (or space), Block S420 can pull the change directly from the phone. Alternatively, a native hearing augmentation application executing on the user's audio device can push the audio output change to a remote server (e.g., via Wi-Fi or cellular communication), such as with a timestamp, a GPS (or other location) coordinate, and/or an ambient noise condition, etc. as described above. Block S420 can then implement methods and techniques described above in Block S320 and Block S330 to select this audio output feedback and other audio output feedbacks similarly collected from users in or near the venue. Block S420 can also select audio output feedbacks asynchronously, such as by selecting or retrieving audio output feedbacks entered on previous dates and stored in a remote database as described above.

As described above in Blocks S320 and S330, Block S420 can dynamically adjust a distance range from the venue at which audio output feedbacks were entered, a range of time between the present time and entry of audio output feedbacks on the same day or on a consonant day, a range of ambient noise conditions during entry of the audio output feedbacks, etc. to achieve a minimum number, a maximum number, or a target number of audio output feedbacks in the set.

Block S430 of the fourth method S400 recites generating a composite audio output feedback from audio output feedbacks within the set of audio output feedbacks. Generally, Block S430 functions to implement methods or techniques similar to those of Blocks S322 and S332 described above to aggregate multiple audio output feedbacks into a composite audio output feedback that can be applied to an audio signal at the venue in Block S440 and output as sound in Block S450.

As described above, Block S430 can also collect hearing profiles and/or hearing test results for user associated with audio output feedbacks collected in Block S420, such as from a remote database, and Block S430 can normalize the audio output feedbacks based on the hearing profiles and/or (recent) hear test results of their corresponding users, such as described above. Block S430 can then identify commonalities across the set of audio output feedbacks, such as at one or more discrete frequencies, over one or more frequency ranges, or across the full audible range, and Block S430 can generate an audio profile based on these commonalities and pass this audio profile to Block S440.

As described above, Block S430 can also weight audio output profiles in the set, such as based on types of feedback in each audio output feedback. For example, new hearing test results or new hearing profiles can be weighted (or ranked) above EQ setting adjustments, which can be weighted above volume changes, which can be ranked above implicit feedback. Block S430 can thus select or rank common features within the audio output feedbacks based on weightings of the audio output feedbacks. For example, Block S430 can extract features from an audio output feedback and assign a number of votes for each feature based on the weight of the audio output feedback, repeat this process for each other audio output feedback in the set, group substantially similar features, then sum votes for each group of similar features and generate an audio profile with a preset number (e.g., three) of the highest-voted features.

However, Block S430 can function in any other way to generate the composite output audio feedback (or the audio profile) from the set of audio output feedbacks.

4.3 Composite Output Feedback

Block S440 recites transforming a local audio signal into a processed audio signal according to the composite audio output feedback, and Block S450 recites outputting the processed audio signal through the audio device in Block S450. Generally, Blocks S440 and S450 can implement methods and techniques described above to apply the composite audio output feedback (or audio profile) output in Block S430 to an audio signal and to output the processed audio signal into the venue.

In one implementation, Blocks S410, S420, and S430 execute on a remote server on behalf of the venue to generate the composite audio output feedback (or audio profile) and then transmit the composite audio output feedback back to the venue. An audio (e.g., stereo, PA) system within the venue downloads the composite audio output feedback, implements Block then processes a local audio signal (e.g., background music, live music) according to the composite audio output feedback. In a similar implementation Blocks S440 executes on the remote server to process an audio signal remotely, and Block S440 transmits the processed audio signal back to the venue wherein an audio system in the venue outputs the processed audio signal in Block S450. For example, Block S440 can process prerecorded music files and broadcast these processed music files to the venue, such as in the form of a radio broadcast customized for hearing needs and/or preferences of people within or near the venue, as shown in FIG. 8. In another example, Block S440 can process an audio signal transmitted from the venue to the remote server substantially in real-time and then broadcast this processed audio signal back to the venue (i.e., back to an audio system or connected device within the venue). Alternatively, Blocks of the fourth method S400 can execute locally within the venue, such as on a "smart" audio system—within the venue—that communicates with a remote database and/or directly with computing device within the venue to collect audio output feedbacks and processes audio signals locally according to the audio output feedbacks.

However, Blocks S440 and S450 can function in any other way to customize an audio signal based on hearing needs and/or preferences of a group of people within a venue and to broadcast the processed audio signal to the group.

The systems and methods of the embodiments can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, or any suitable combination thereof. Other systems and methods of the embodiments can be embodied and/or implemented at least in part as a machine configured to receive a computer-readable medium storing computer-readable instructions. The instructions can be executed by computer-executable components integrated by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor, though any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

We claim:
1. A method for augmenting a listening experience of a user through an audio device, the method comprising:
   detecting a location of the audio device;
   selecting a set of audio output feedbacks, each audio output feedback in the set of audio output feedbacks entered by an individual and associated with a physical site proximal to the location;
   identifying a common feature across audio output feedbacks within the set of audio output feedbacks;
   transforming an audio signal into a processed audio signal according to a hearing profile of the user and the common feature; and outputting the processed audio signal through the audio device.

2. The method of claim 1, wherein selecting the set of audio output feedbacks comprises selecting audio output feedback submitted by an individual into a device at a physical site within a range of the location.

3. The method of claim 2, wherein selecting the set of audio output feedbacks comprises adjusting the range to realize a target minimum number of audio output feedbacks in the set of audio output feedbacks, each audio output feedback in the set of audio output feedbacks entered into a computing device within the range of the location.

4. The method of claim 1, further comprising identifying a present time of day at the location, and wherein selecting the set of audio output feedbacks comprises selecting an audio output feedback entered by an individual on a previous date at a time of day within a threshold time of the present time of day.

5. The method of claim 1, further comprising recording an ambient sound through a microphone within the audio device and characterizing the ambient sound as a current ambient noise condition proximal to the audio device, and wherein selecting the set of audio output feedbacks comprises selecting an audio output feedback associated with a previous ambient noise condition substantially similar to the current ambient noise condition.

6. The method of claim 1, further comprising retrieving a demographic of the user, selecting from the set of audio output feedbacks a particular audio output feedback entered by a particular individual of a demographic substantially consonant with the demographic of the user, and extracting a relevant feature from the particular audio output feedback, and wherein transforming the audio signal into the processed audio signal comprises transforming the audio signal into the processed audio signal further based on the relevant feature.

7. The method of claim 6, wherein retrieving the demographic of the user comprises retrieving an age of the user from a user profile, and wherein selecting the particular audio output feedback comprises selecting the particular audio output feedback entered by the particular individual within an age bracket comprising the age of the user.

8. The method of claim 1, wherein selecting the set of audio output feedbacks comprises retrieving a first audio output feedback and a second audio output feedback from a database, the first audio output feedback comprising a volume adjustment submitted by a first individual into a first device proximal to the location, the second audio output feedback comprising an equalizer adjustment submitted by a second individual into a second device proximal to the location, wherein identifying the common feature comprises identifying a volume change over a particular frequency range common to the first audio output feedback and the second audio output feedback, and wherein transforming the audio signal into the processed audio signal comprises applying the volume change over the particular frequency range to the audio signal.

9. The method of claim 1, wherein selecting the set of audio output feedbacks comprises retrieving a first audio output feedback and a second audio output feedback, the first audio output feedback characterized by a lack of explicit audio output adjustment entered into a first device proximal to the location, the second audio output feedback characterized by submission of a hearing test by a second user into a second device proximal to the location, wherein identifying the common feature comprises applying a first weight to the first audio output feedback, applying a second weight greater than the first weight to the second audio output feedback, and identifying the common feature from weighted audio output feedbacks within the set of audio output feedbacks.

10. The method of claim 1, wherein identifying the common feature comprises identifying a first equalizer setting adjustment entered manually by a first individual into a first computing device, identifying a second equalizer setting adjustment entered manually by a second individual into a second computing device and substantially similar to the first equalizer setting adjustment, and generating a composite equalizer setting adjustment from the first equalizer setting adjustment and the second equalizer setting adjustment, and wherein transforming the audio signal into the processed audio signal comprises transforming the audio signal into the processed audio signal according to the composite equalizer setting adjustment.

11. A method for augmenting a listening experience of a user through an audio device, the method comprising:
- detecting a trigger event at the audio device;
- retrieving a demographic of the user;
- selecting a set of audio output feedbacks, each audio output feedback in the set of audio output feedbacks entered into a device, at a previous event consonant with the trigger, by an individual of known demographic consonant with the demographic of the user;
- generating a composite audio output feedback comprising audio output feedbacks from the set of audio output feedbacks;
- transforming an audio signal into a processed audio signal according to a hearing profile of the user and the composite audio output feedback;
- outputting the processed audio signal through the audio device;
- selecting a second set of audio output feedbacks entered by individuals at previous events consonant with the trigger; and
- identifying a common feature across audio output feedbacks within the sets of audio output feedbacks, wherein transforming the audio signal into the processed audio signal comprises transforming the audio signal into the processed audio signal further based on the common feature.

12. The method of claim 11, wherein detecting the trigger comprises detecting a location of the audio device, wherein retrieving the demographic of the user comprises retrieving an age group of the user, and wherein selecting the set of audio output feedbacks comprises identifying a group of audio output feedbacks stored in a database and culling the set of audio output feedbacks from the group of audio output feedbacks, each audio output feedback in the group of audio output feedbacks submitted by an individual into a device at a physical site within a range of the location, and each audio output feedback in the set of audio output feedbacks submitted by an individual within the age group of the user.

13. The method of claim 11, wherein retrieving the demographic of the user comprises characterizing a hearing ability of the user based on the hearing profile of the user, and wherein selecting the set of audio output feedbacks comprises selecting audio output feedbacks associated with individuals of known hearing abilities substantially similar to the hearing ability of the user.

14. The method of claim 11, wherein detecting the trigger event comprises detecting a change in activity of the user, and wherein selecting the set of audio output feedbacks comprises selecting audio output feedback entered by an individual within a threshold period of time from a detected change in action consonant with the change in activity of the user.

15. The method of claim 11, wherein transforming the audio signal into the processed audio signal comprises transforming a prerecorded music signal into the processed audio signal, and wherein outputting the processed audio signal through the audio device comprises outputting the processed audio signal to a pair of headphones connected to the audio device.

16. The method of claim 11, wherein selecting the set of audio output feedbacks comprises retrieving a first audio output feedback and a second audio output feedback from a database, the first audio output feedback comprising a volume adjustment submitted by a first individual into a first device proximal to the location, the second audio output feedback comprising an equalizer adjustment submitted by a second individual into a second device proximal to the location, wherein generating the composite audio output feedback comprises identifying a relative volume change over a particular frequency range common to the first audio output feedback and the second audio output feedback and applying the relative volume change to the audio signal over the particular frequency range.

17. A method for augmenting a group listening experience comprising:
  detecting a set of computing devices within a range of a location of an audio device;
  retrieving a set of hearing profiles, each hearing profile in the set of hearing profiles generated for a corresponding individual based on a hearing test completed by the corresponding individual proximal to the location;
  generating a composite hearing profile from hearing profiles within the set of hearing profiles;
  transforming a local audio signal into a processed audio signal according to the composite hearing profile;
  outputting the processed audio signal through the audio device;
  retrieving a set of audio output feedbacks, each audio output feedback in the set of audio output feedbacks corresponding to an individual associated with a hearing profile in the set of hearing profiles; and
  selecting audio output feedbacks from the set of audio output feedbacks, comprising retrieving a first audio output feedback, a second audio output feedback, and a third audio output feedback from a database, the first audio output feedback characterized by submission of a hearing test by a first user into a third computing device within the threshold range of the location, the second audio output feedback comprising a volume adjustment submitted by a second individual into a second computing device within a threshold range of the location, and the third audio output feedback characterized by no audio output adjustment entered into a first computing device proximal to the location.

18. The method of claim 17, wherein selecting the set of hearing profiles comprises selecting hearing profiles based on hearing tests completed by individuals at physical sites within a range of the location within a threshold time of a present time, and wherein selecting the set of hearing profiles comprises adjusting the range to realize a target minimum number of hearing profiles in the set of hearing profiles.

19. The method of claim 17, further comprising generating a composite audio output feedback from the set of audio output feedbacks, wherein transforming the local audio signal into the processed audio signal further comprises applying the composite audio output feedback to the audio signal.

20. The method of claim 17, wherein generating the composite audio output feedback comprises weighting the first audio output feedback above the second audio output feedback, weighting the second audio output feedback above the third audio output feedback, and aggregating audio output feedbacks within the set of audio output feedbacks into the composite audio output feedback according to weights of the audio output feedbacks.

* * * * *